United States Patent
Hoegerl et al.

(10) Patent No.: US 10,115,646 B2
(45) Date of Patent: Oct. 30, 2018

(54) SEMICONDUCTOR ARRANGEMENT, SEMICONDUCTOR SYSTEM AND METHOD OF FORMING A SEMICONDUCTOR ARRANGEMENT

(71) Applicant: Infineon Technologies AG, Neubiberg (DE)

(72) Inventors: Juergen Hoegerl, Regensburg (DE); Edward Fuergut, Dasing (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/149,207

(22) Filed: May 9, 2016

(65) Prior Publication Data
US 2016/0365295 A1 Dec. 15, 2016

(30) Foreign Application Priority Data
Jun. 10, 2015 (DE) .......... 10 2015 109 186

(51) Int. Cl.
*H01L 23/31* (2006.01)
*H01L 21/56* (2006.01)
(Continued)

(52) U.S. Cl.
CPC ............ *H01L 23/31* (2013.01); *H01L 21/561* (2013.01); *H01L 21/566* (2013.01); *H01L 23/04* (2013.01);
(Continued)

(58) Field of Classification Search
CPC ... H01L 2924/10155; H01L 2924/1016; H01L 2924/10252; H01L 2924/10253;
(Continued)

(56) References Cited

U.S. PATENT DOCUMENTS 4,646,129 A * 2/1987 Yerman ................. H01L 23/049
257/698
4,907,067 A * 3/1990 Derryberry ........... H01L 23/057
257/700
(Continued)

FOREIGN PATENT DOCUMENTS

CN 102034879 A 4/2011
CN 104064529 A 9/2014
(Continued)

*Primary Examiner* — Eva Y Montalvo
*Assistant Examiner* — Kevin Quinto
(74) *Attorney, Agent, or Firm* — Viering, Jentschura & Partner MBB

(57) ABSTRACT

A semiconductor arrangement is provided. The semiconductor arrangement may include an electrically conductive plate having a surface, a plurality of power semiconductor devices arranged on the surface of the electrically conductive plate, wherein a first controlled terminal of each power semiconductor device of the plurality of power semiconductor devices may be electrically coupled to the electrically conductive plate, a plurality of electrically conductive blocks, wherein each electrically conductive block may be electrically coupled with a respective second controlled terminal of each power semiconductor device of the plurality of power semiconductor devices; and encapsulation material encapsulating the plurality of power semiconductor devices, wherein at least one edge region of the surface of the electrically conductive plate may be free from the encapsulation material.

26 Claims, 15 Drawing Sheets

(51) Int. Cl.
| | |
|---|---|
| *H01L 23/04* | (2006.01) |
| *H01L 23/10* | (2006.01) |
| *H01L 23/492* | (2006.01) |
| *H01L 23/14* | (2006.01) |
| *H01L 23/29* | (2006.01) |
| *H01L 23/495* | (2006.01) |
| H01L 23/498 | (2006.01) |
| H01L 23/538 | (2006.01) |
| H01L 29/739 | (2006.01) |
| H01L 29/868 | (2006.01) |
| H01L 23/544 | (2006.01) |
| H01L 23/00 | (2006.01) |

(52) U.S. Cl.
CPC ............ *H01L 23/10* (2013.01); *H01L 23/142* (2013.01); *H01L 23/295* (2013.01); *H01L 23/492* (2013.01); *H01L 23/49562* (2013.01); *H01L 24/24* (2013.01); *H01L 24/29* (2013.01); *H01L 24/50* (2013.01); *H01L 24/66* (2013.01); *H01L 24/82* (2013.01); *H01L 24/92* (2013.01); *H01L 24/97* (2013.01); H01L 21/568 (2013.01); H01L 23/3121 (2013.01); H01L 23/3142 (2013.01); H01L 23/4924 (2013.01); H01L 23/4928 (2013.01); H01L 23/49877 (2013.01); H01L 23/5386 (2013.01); H01L 23/544 (2013.01); H01L 24/06 (2013.01); H01L 24/27 (2013.01); H01L 24/32 (2013.01); H01L 24/33 (2013.01); H01L 24/40 (2013.01); H01L 24/48 (2013.01); H01L 24/69 (2013.01); H01L 24/73 (2013.01); H01L 24/83 (2013.01); H01L 24/86 (2013.01); H01L 24/89 (2013.01); H01L 29/7393 (2013.01); H01L 29/868 (2013.01); H01L 2223/54486 (2013.01); H01L 2224/04026 (2013.01); H01L 2224/06181 (2013.01); H01L 2224/24137 (2013.01); H01L 2224/2732 (2013.01); H01L 2224/291 (2013.01); H01L 2224/293 (2013.01); H01L 2224/2929 (2013.01); H01L 2224/29294 (2013.01); H01L 2224/29311 (2013.01); H01L 2224/29318 (2013.01); H01L 2224/29339 (2013.01); H01L 2224/29347 (2013.01); H01L 2224/29499 (2013.01); H01L 2224/32245 (2013.01); H01L 2224/33181 (2013.01); H01L 2224/40137 (2013.01); H01L 2224/48137 (2013.01); H01L 2224/73201 (2013.01); H01L 2224/73213 (2013.01); H01L 2224/73215 (2013.01); H01L 2224/73217 (2013.01); H01L 2224/73219 (2013.01); H01L 2224/73251 (2013.01); H01L 2224/73263 (2013.01); H01L 2224/73265 (2013.01); H01L 2224/73267 (2013.01); H01L 2224/8384 (2013.01); H01L 2224/8385 (2013.01); H01L 2224/83101 (2013.01); H01L 2224/83191 (2013.01); H01L 2224/83192 (2013.01); H01L 2224/83193 (2013.01); H01L 2224/83801 (2013.01); H01L 2224/83815 (2013.01); H01L 2224/83825 (2013.01); H01L 2224/83851 (2013.01); H01L 2224/83855 (2013.01); H01L 2224/8484 (2013.01); H01L 2224/8485 (2013.01); H01L 2224/84801 (2013.01); H01L 2224/92142 (2013.01); H01L 2224/92144 (2013.01); H01L 2224/92147 (2013.01); H01L 2224/92148 (2013.01); H01L 2224/92242 (2013.01); H01L 2224/92244 (2013.01); H01L 2224/92248 (2013.01); H01L 2224/97 (2013.01); H01L 2924/00014 (2013.01); H01L 2924/1016 (2013.01); H01L 2924/1032 (2013.01); H01L 2924/10155 (2013.01); H01L 2924/10252 (2013.01); H01L 2924/10253 (2013.01); H01L 2924/10271 (2013.01); H01L 2924/10272 (2013.01); H01L 2924/10329 (2013.01); H01L 2924/10331 (2013.01); H01L 2924/10332 (2013.01); H01L 2924/10335 (2013.01); H01L 2924/1301 (2013.01); H01L 2924/1305 (2013.01); H01L 2924/13055 (2013.01); H01L 2924/13091 (2013.01); H01L 2924/15162 (2013.01); H01L 2924/181 (2013.01); H01L 2924/1815 (2013.01)

(58) Field of Classification Search
CPC . H01L 2924/10271; H01L 2924/10272; H01L 2924/1032; H01L 2924/10329; H01L 2924/10331; H01L 2924/10332; H01L 2924/10335; H01L 2924/1301; H01L 2924/1305
See application file for complete search history.

(56) References Cited

U.S. PATENT DOCUMENTS

| | | | |
|---|---|---|---|
| 6,921,969 | B2 | 7/2005 | Knapp |
| 8,981,545 | B2 | 3/2015 | Hohlfeld et al. |
| 2003/0116839 | A1 | 6/2003 | Knapp |
| 2011/0073177 | A1* | 3/2011 | Osawa ................ H01G 9/2027 136/256 |
| 2014/0035117 | A1 | 2/2014 | Hohlfeld et al. |
| 2014/0061673 | A1 | 3/2014 | Miyanagi |
| 2014/0284624 | A1 | 9/2014 | Beer et al. |
| 2014/0299979 | A1 | 10/2014 | Danno et al. |
| 2015/0054166 | A1 | 2/2015 | Beer et al. |
| 2015/0061100 | A1 | 3/2015 | Beer et al. |
| 2015/0061144 | A1 | 3/2015 | Beer et al. |

FOREIGN PATENT DOCUMENTS

| | | |
|---|---|---|
| CN | 104465566 A | 3/2015 |
| DE | 102012202281 A1 | 8/2013 |
| DE | 102012211446 A1 | 1/2014 |
| DE | 102013216709 A1 | 2/2015 |
| DE | 102013217801 A1 | 3/2015 |
| DE | 102013217802 A1 | 3/2015 |
| EP | 0096266 A2 | 12/1983 |
| EP | 1324386 A1 | 7/2003 |
| EP | 1860696 A1 * | 11/2007 |
| EP | 1860696 A1 | 11/2007 |

* cited by examiner

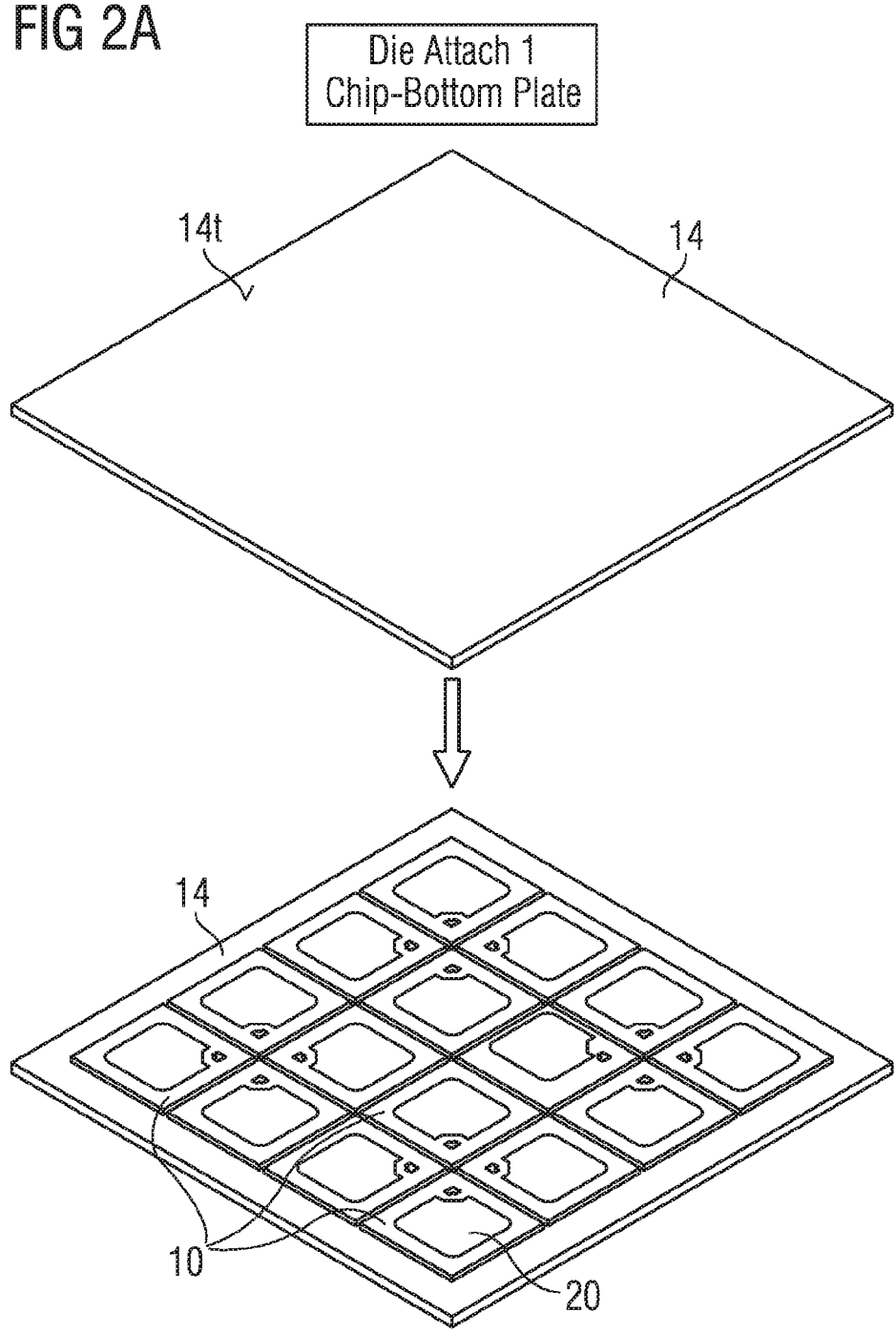

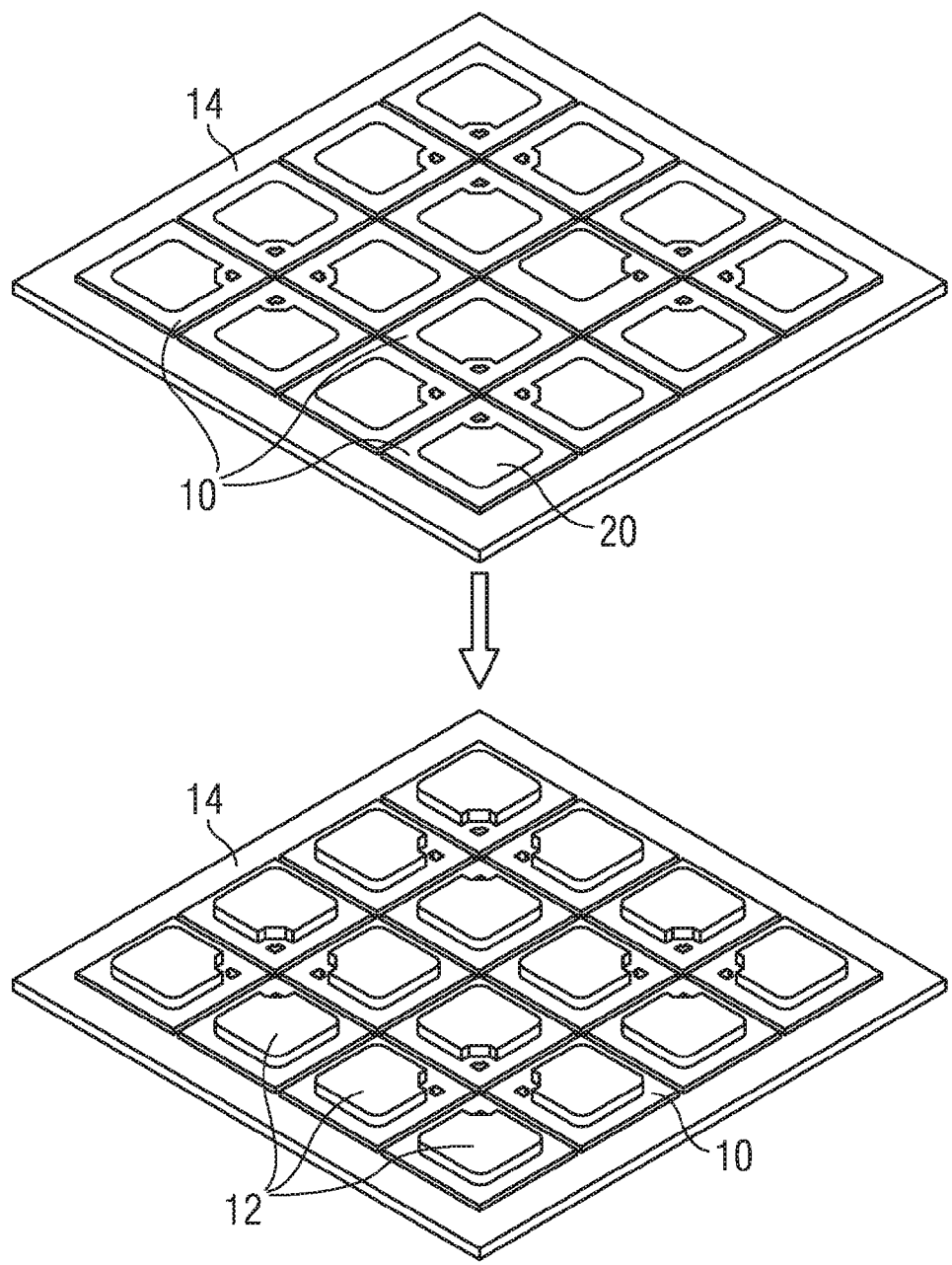

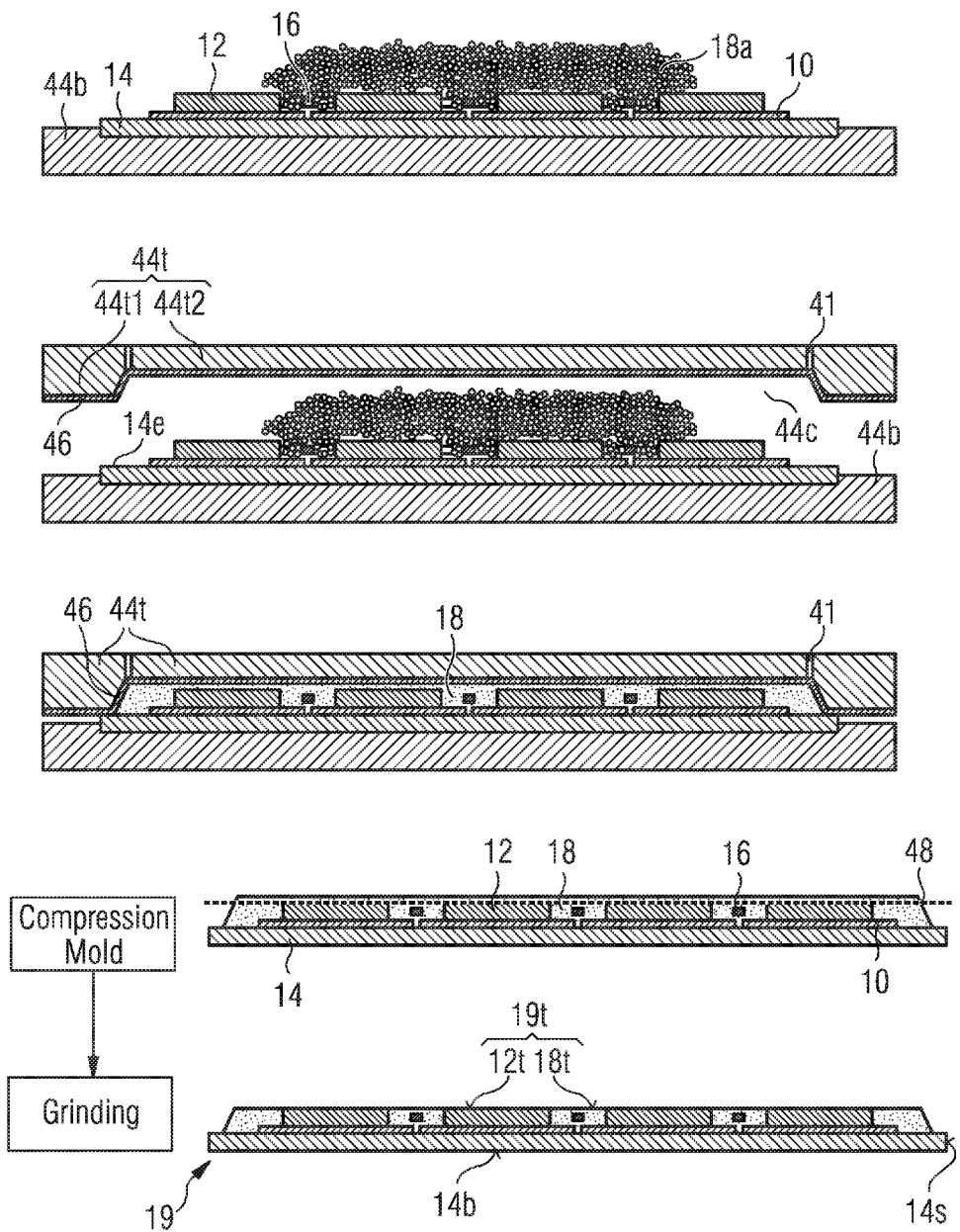

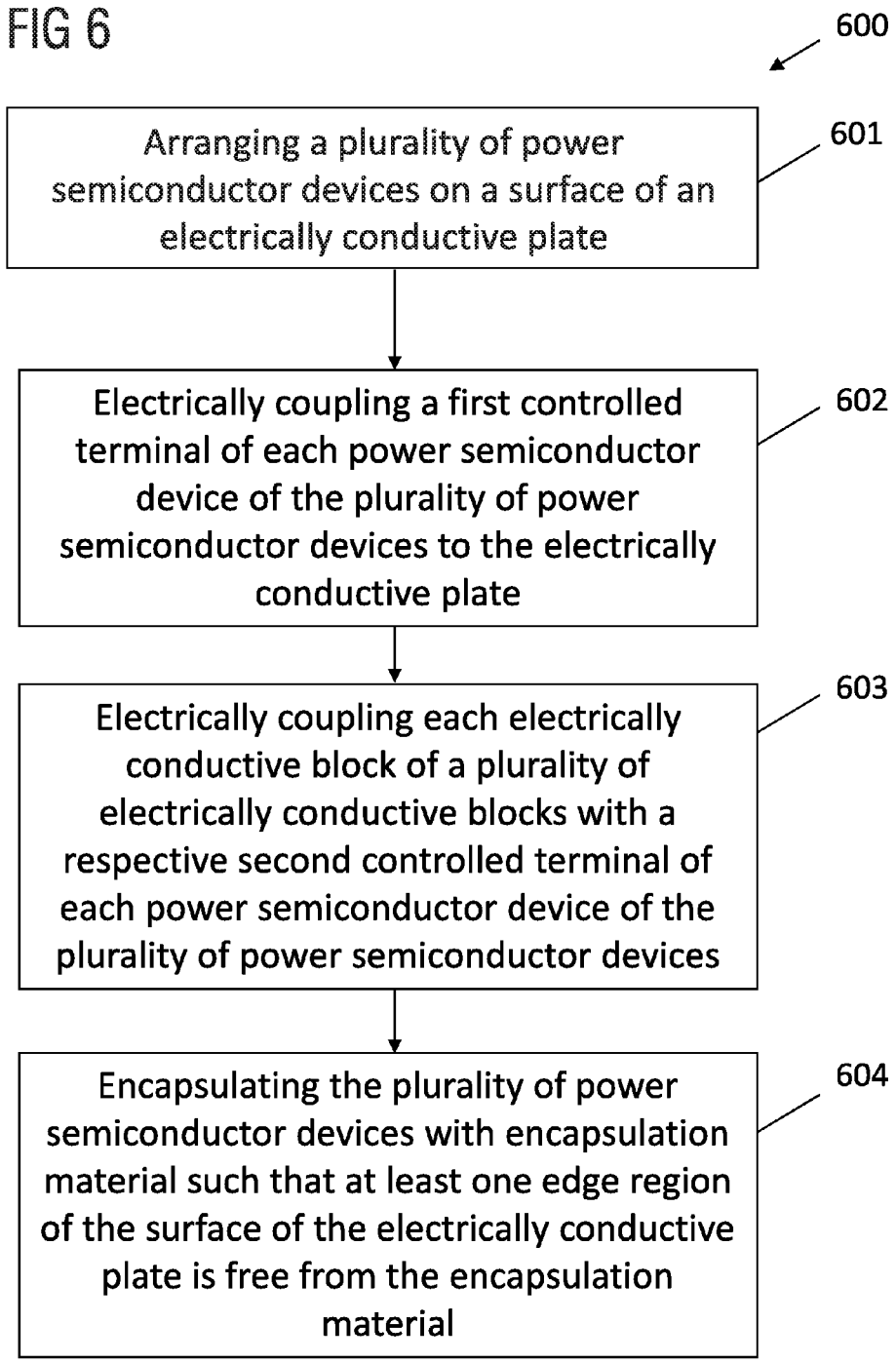

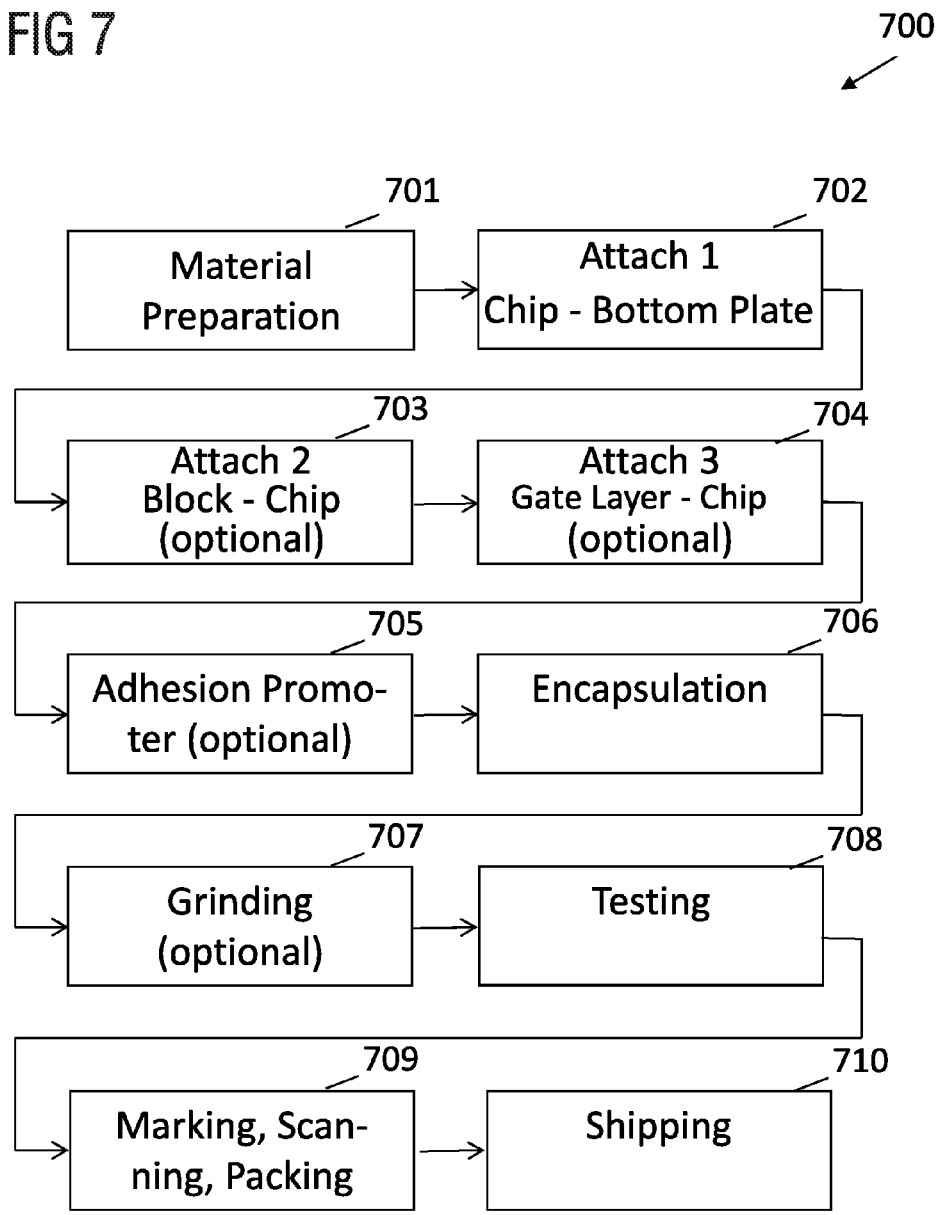

SEMICONDUCTOR ARRANGEMENT, SEMICONDUCTOR SYSTEM AND METHOD OF FORMING A SEMICONDUCTOR ARRANGEMENT

CROSS-REFERENCE TO RELATED APPLICATION

This application claims priority to German Patent Application Serial No. 10 2015 109 186.0, which was filed Jun. 10, 2015, and is incorporated herein by reference in its entirety.

TECHNICAL FIELD

Various embodiments relate generally to a semiconductor arrangement, to a semiconductor system and to a method of forming a semiconductor arrangement.

BACKGROUND

A conventional semiconductor arrangement, e.g. an arrangement including a plurality of power semiconductor devices, e.g. a press pack array, may be formed by at least partially encapsulating the plurality of power semiconductor devices and a electrically conductive plate, which may form a common terminal, e.g. a common controlled terminal, e.g. a common collector contact, in an, e.g. dielectric, encapsulation material. The encapsulation may be arranged to enclose the electrically conductive plate from five sides, i.e. on a top surface on which the power semiconductor devices may be arranged, and on side surfaces contacting the top surface. A bottom surface of the electrically conductive plate may be free or at least partially free from the encapsulation material.

This means that an interface between the electrically conductive plate and the encapsulation material may be created that may be open to an outside environment. Through this interface, humidity or other substances that may be harmful to the semiconductor arrangement may enter the semiconductor arrangement and reach the power semiconductor devices, thereby potentially damaging the semiconductor arrangement.

Furthermore, the semiconductor arrangement may for its operation be held in a holding device. In a case where the holding device attaches to the sides of the semiconductor arrangement, it may have to attach to the encapsulation material, which may represent a weak spot of the semiconductor arrangement.

SUMMARY

A semiconductor arrangement is provided. The semiconductor arrangement may include an electrically conductive plate having a surface, a plurality of power semiconductor devices arranged on the surface of the electrically conductive plate, wherein a first controlled terminal of each power semiconductor device of the plurality of power semiconductor devices may be electrically coupled to the electrically conductive plate, a plurality of electrically conductive blocks, wherein each electrically conductive block may be electrically coupled with a respective second controlled terminal of each power semiconductor device of the plurality of power semiconductor devices; and encapsulation material encapsulating the plurality of power semiconductor devices, wherein at least one edge region of the surface of the electrically conductive plate may be free from the encapsulation material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 2A to 2H show semiconductor arrangements according to various embodiments during different stages of their manufacture. FIG. 2A to FIG. 2C show perspective views, FIG. 2D to FIG. 2H show cross-sectional views;

FIG. 6 shows a diagram illustrating a method of forming a semiconductor arrangement in accordance with various embodiments; and FIG. 7 shows a diagram illustrating a method of forming a semiconductor arrangement in accordance with various embodiments.

DESCRIPTION

Figure 1A:
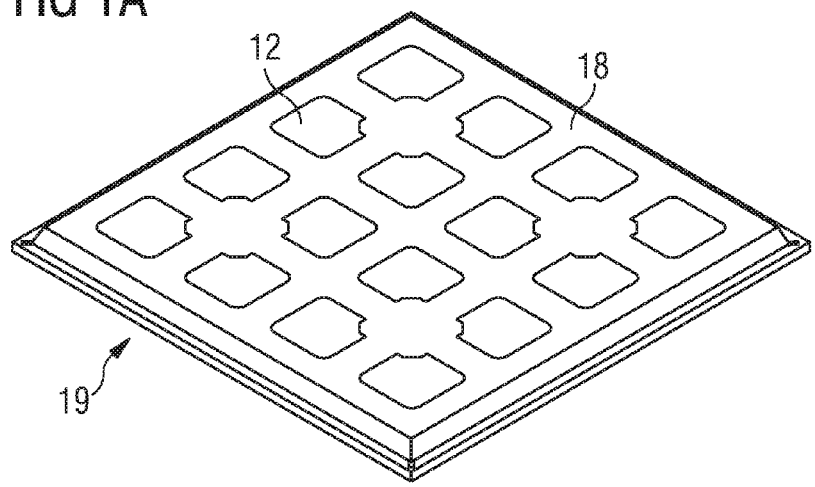
FIG. 1A to 1C show a semiconductor arrangement according to various embodiments as a cross-sectional view in FIG. 1B, and as perspective views of the semiconductor arrangement or of parts thereof, respectively, in FIG. 1A and FIG. 1C.
Figure 1A:
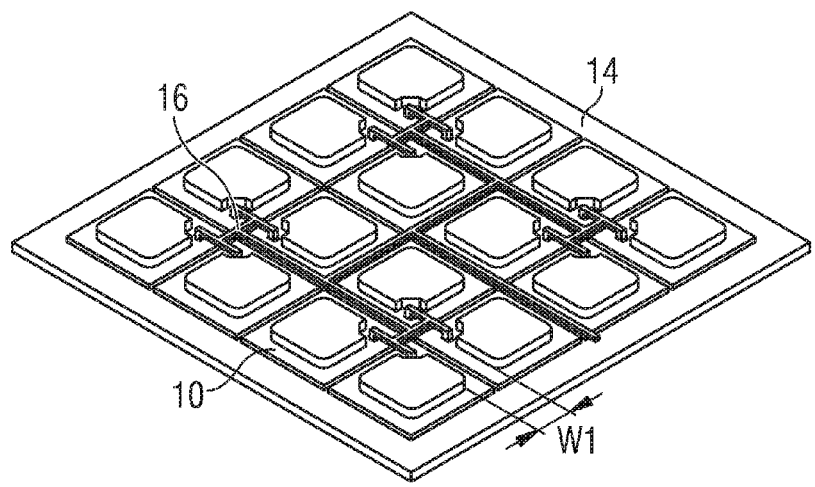

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The word "ring" is to be understood as referring to a structure that closes upon itself in a ring-like fashion, without necessarily being circular in shape (i.e. enclosing a circular area) or being planar. In other words, the ring may enclose an arbitrarily shaped area, e.g. a circular, ellipsoid or polygonal, e.g. rectangular, area, that may be planar or bent in space.

Various aspects of the disclosure are provided for devices, and various aspects of the disclosure are provided for methods. It will be understood that basic properties of the devices also hold for the methods and vice versa. Therefore, for the sake of brevity, duplicate description of such properties may have been omitted.

In various embodiments, a semiconductor arrangement may include a plurality of power semiconductor devices, a plurality of electrically conductive blocks, and an electrically conductive plate. Each of the power semiconductor devices may include a semiconductor body having a top side and an underside opposite the top side, a first controlled terminal arranged on the underside, and a second controlled terminal arranged on the top side. Furthermore, the power semiconductor device may include a control terminal, which may be arranged at the top side and by means of which an electric current between the first controlled terminal and the second controlled terminal can be controlled.

Controlled terminals in this sense are to be understood to mean terminals, also referred to as electrodes, between which a load current may flow through the semiconductor body during the operation of the semiconductor chip.

In various embodiments, the power semiconductor devices may be material bonded to one another by an encapsulation material, e.g. a dielectric encapsulation material, to form a solid composite, wherein both the power semiconductor devices and the encapsulation material may be constituent parts of the composite. Here, in the case of each of the power semiconductor devices, that side of the first controlled terminal, the second controlled terminal and of the control terminal, respectively, of the relevant chip assembly which faces away from the semiconductor body may be not or at least not completely covered by the encapsulation material.

In various embodiments, the above described problems may be solved by arranging the encapsulation material in such a way that at least one edge region of the surface of the electrically conductive plate is free from the encapsulation material. For example, a rim of the electrically conductive plate may remain free from the encapsulation material on the surface on which the plurality of power semiconductor devices may be arranged.

In this way, in various embodiments, the electrically conductive plate may protrude, in its plane, beyond the encapsulation material. A holding device may attach to the portion of the electrically conductive plate protruding beyond the encapsulation material. In other words, the holding device may use the electrically conductive plate, e.g. the electrically conductive plate only, for holding the semiconductor arrangement, thereby providing an attachment to a part of the semiconductor arrangement that may not represent a weak spot of the semiconductor arrangement.

Furthermore, in various embodiments, a sealing structure may be arranged on the at least one edge region of the surface of the electrically conductive plate. Thereby, a path between the encapsulation material and the electrically conductive plate connecting an outside with the plurality of power semiconductor devices may be sealed off from the outside. In combination with a sealing of a path between the encapsulation material and the plurality of electrically conductive blocks connecting an outside with the plurality of power semiconductor devices, e.g. an electrically conductive layer, e.g. a metal layer arranged over the plurality of electrically conductive blocks and the encapsulation material, an hermetic sealing of the plurality of power semiconductor devices may in various embodiments be provided.

In various embodiments, the arrangement of the plurality of power semiconductor devices on the electrically conductive plate may be such that a separating of the semiconductor arrangement into smaller units, e.g. by sawing, may be omitted, thereby saving processing time.

Figure 1B:
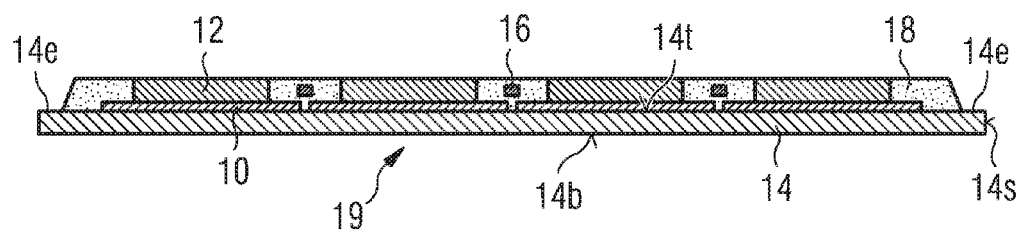
Figure 1C:
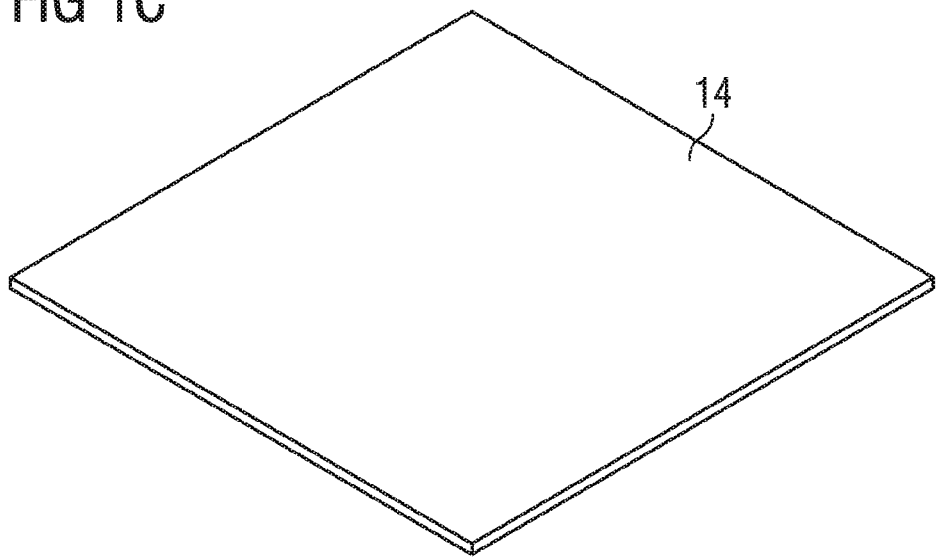
Figure 1C:
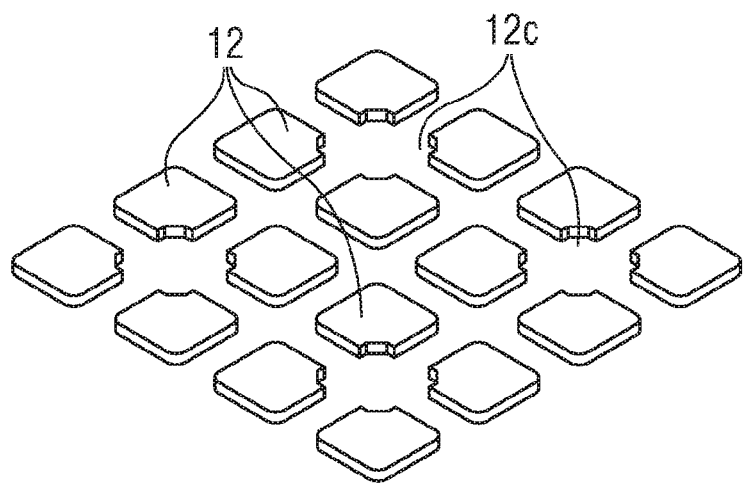

FIGS. 1A to 1C show a semiconductor arrangement 19 according to various embodiments as a cross-sectional view in FIG. 1B, and as perspective views of the semiconductor arrangement 19 or of parts thereof, respectively, in FIG. 1A and FIG. 1C.

In various embodiments, the semiconductor arrangement 19 may include a plurality of semiconductor devices 10. Each of the semiconductor devices 10 may include a semiconductor body. The semiconductor body may include a basic semiconductor material, in which p-conducting and n-conducting semiconductor zones may be contained in order to realize a power semiconductor component integrated into the semiconductor body. Moreover, the semiconductor chip may also have as many dielectric layers as desired, and electrically conductive layers such as, for example, metallizations, layers composed of doped polycrystalline semiconductor material such as, for example, polycrystalline silicon, silicide layers, but also arbitrary dielectric layers such as, for example, nitride layers (e.g. silicon nitride) or oxide layers (e.g. silicon oxide), or passivation layers such as e.g. imide layers.

The basic semiconductor material may be any known basic semiconductor material that is customary for producing semiconductor components, for example arbitrary elemental semiconductors (e.g. silicon, germanium), arbitrary compound semiconductors (e.g. gallium nitride on silicon, II-VI semiconductors such as zinc selenide or cadmium sulfide, III-V semiconductors such as gallium phosphide, gallium arsenide, indium phosphide, indium antimonide, or IV-IV semiconductors such as silicon carbide or silicon-germanium).

At least a portion of the electrically conductive layers may be formed as terminals. Each of the power semiconductor devices 10 may include a first controlled terminal arranged on a bottom side, and a second controlled terminal arranged on a top side.

The power semiconductor devices 10 may for example include a diode, or a MOSFET, an IGBT, generally an IGFET, a bipolar transistor, a thyristor, or any other controllable power semiconductor component. The first and second controlled terminals may generally be cathode and anode, anode and cathode, source and drain, drain and source, collector and emitter or emitter and collector of an arbitrary power semiconductor device.

If the power semiconductor device 10 is a controllable power semiconductor device 10, that is to say a power semiconductor device 10 having a control terminal such as e.g. a gate terminal (e.g. MOSFET, IGBT, IGFET, thyristor) or a base terminal (e.g. bipolar transistor excluding IGBT), a control terminal may be additionally present, which may be situated at the top side and by means of which an electric current between the first controlled terminal and the second controlled terminal can be controlled.

In various embodiments, the plurality of power semiconductor devices 10 may include only one type of semiconductor device, for example only IGBTs or only MOSFETS, e.g. with identical properties or with properties varying between the individual semiconductor devices 10.

In various embodiment, the plurality of semiconductor devices 10 may include more than one type of semiconductor device, for example a mixture of IGBTs and MOSFETS, a mixture of any of the semiconductor devices 10 described above, or the like.

In various embodiments, a plurality of electrically conductive blocks 12 may be situated on the side of each of the second controlled terminals facing away from the semiconductor bodies, i.e. above the semiconductor devices 10 as shown in FIG. 1B, and may be material bonded to the respective second controlled terminals by a top connecting layer (not shown).

In various embodiments, each electrically conductive block 12 of the plurality of electrically conductive blocks 12 may be placed on the corresponding power semiconductor device 10 individually, for example using a pick-and-place-process.

In various embodiments, the plurality of electrically conductive blocks 12 may be connected to each other, for example as an array matching the arrangement of the plurality of power semiconductor devices 10, and the plurality of electrically conductive blocks 12 may be placed on the plurality of power semiconductor devices 10 jointly, e.g. in a common process.

In various embodiments, a mixture of the two methods of placing the plurality of electrically conductive blocks 12 on the plurality of power semiconductor devices maybe employed, for example by placing one or more electrically conductive blocks 12 individually, and a plurality of electrically conductive blocks 12 jointly.

In various embodiments, a (single) electrically conductive plate 14 with a surface 14t (which may also be referred to as the top surface 14t), a second surface 14b (which may also be referred to as the bottom surface 14b) opposite the surface 14t and a side surface 14s connecting the surface 14t and the second surface 14b may be situated on the side of the first controlled terminal facing away from the plurality of semiconductor bodies, i.e. below the semiconductor devices 10 as shown in FIG. 1B, and may be material bonded to the first controlled terminal by a bottom connecting layer (not shown).

In various embodiments, a plurality of electrically conductive pieces may optionally be arranged on the control terminals, which electrically conductive piece may be cohesively and electrically conductively connected to the control terminals by the top connecting layer, wherein a direct electrical connection or a shortcut connection through the top connecting layer between the electrically conductive pieces and the electrically conductive blocks 12 may be avoided. If such an electrically conductive piece is provided, the adjacent electrically conductive block 12 may have a cutout 12c (FIG. 1C), in which the electrically conductive piece may be positioned.

The electrically conductive plate 14 and the electrically conductive blocks 12 may serve to reduce mechanical stress which may occur if such a semiconductor arrangement 19 may be subjected to pressure contact-connection by a pair of contact plates (e.g. including or consisting of copper), which will be explained later (see e.g. FIG. 5, contact plates 74t and 74b). The contact plates may have a coefficient of thermal expansion which may be greatly different from the coefficient of thermal expansion of the semiconductor body. In the absence of the electrically conductive blocks 12 and the electrically conductive plate 14, the contact plates would make contact directly with the very thin first and second terminals, respectively. This may give rise to thermomechanical stress which may cause a variation in the electrical properties of the semiconductor devices 10 or even to a damaging of the semiconductor devices 10.

In various embodiments, the plurality of electrically conductive blocks 12 and—if present—the electrically conductive pieces may have (before mounting on the second controlled terminal and the control terminal, respectively, and directly after mounting) relatively large thicknesses in the vertical direction, for example at least 20 μm, 0.5 mm, at least 1 mm, or at least 2 mm, for allowing the plurality of electrically conductive blocks 12 and—if present—the electrically conductive pieces to be ground, as will be explained later. In a case of no grinding being necessary, the plurality of electrically conductive blocks 12 and—if present—the electrically conductive pieces may have a smaller, e.g. final, thickness, e.g. smaller than 20 mm, e.g. 1.3 mm or smaller than 1.0 mm, e.g. smaller than 20 μm. In a case of the electrically conductive blocks and/or pieces including or consisting of thick deposited copper, a thickness of the thick deposited copper may be in a range from about 5 μm to about 100 μm, e.g. from about 10 μm to about 20 μm. In various embodiments, each of the electrically conductive blocks 12 may consist of a block of electrically conductive material, e.g. a metal block, and thick deposited copper.

In various embodiments, a size of each of the electrically conductive blocks 12 in a horizontal direction, i.e. orthogonal to their thickness, may be of the order of a horizontal size of each of the power semiconductor devices 10. Each electrically conductive block 12 may for example be smaller, e.g. slightly smaller, than the power semiconductor device 10 to which it is connected, as e.g. shown in FIG. 2A. In various embodiments, each electrically conductive block 12 may have approximately the same size as the power semiconductor device 10 to which it is connected, or it may be larger. In various embodiments, the size in the horizontal direction, e.g. a maximum size, may be in a range from about 250 μm to about 30 mm, e.g. about 9.2 mm.

In various embodiments, a top surface 12t (see FIG. 2E) of each electrically conductive block 12 may be very planar. For example, no point of the top surface 12t may deviate from an ideal plane by more than about 10 μm, e.g. by less than 8 μm. A surface opposite the top surface 12t of each electrically conductive block 12 may be similarly planar. Furthermore, the top surface 12t and the opposite surface may be very parallel to each other. In various embodiments, an angle difference between the two surfaces may be small enough such that a thickness difference at various positions of each electrically conductive block 12 caused by the angle difference may be smaller than about 20 μm, e.g. smaller than about 10 μm.

In various embodiments, a thickness variation between the individual electrically conductive blocks 12 of the plurality of electrically conductive blocks 12 may be small. A maximum deviation from an average thickness of the plurality of electrically conductive blocks 12 may for example be smaller than about 30 μm, e.g. smaller than about 25 μm, e.g. smaller than about 20 μm. In various embodiment, a thickness variation between the individual electrically conductive blocks 12 of the plurality of electrically conductive blocks 12 may be desired, for example for compensating thickness variations between the individual power semiconductor devices 10 of the plurality of power semiconductor devices 10. In that case, the individual thicknesses of the electrically conductive blocks 12 (and of the individual power semiconductor devices 10, if applicable) may be precisely known, e.g. by determining, e.g. measuring the thickness and sorting the electrically conductive blocks 12 (and the individual power semiconductor devices 10, if applicable) according to thickness.

In various embodiments, the electrically conductive plate 14 may have a relatively large thicknesses in the vertical direction, for example at least 0.2 mm, at least 1 mm, or at least 1.5 mm. In a case of the electrically conductive plate including or consisting of thick deposited copper, a thickness of the thick deposited copper may be in a range from about 5 µm to about 100 µm, e.g. from about 10 µm to about 20 µm.

In various embodiments, a size of the electrically conductive plate 14 in a horizontal direction, i.e. orthogonal to its thickness, may be larger than twice the horizontal size of each of the power semiconductor devices 10, such that the plurality of power semiconductor devices 10 may be mounted on the electrically conductive plate 14 adjacent to each other with minimum horizontal width W1 between them (for electrical insulation from each other). In various embodiments, the plurality of power semiconductor devices 10 may be arranged as an array of m×n power semiconductor devices 10, e.g. as an array of 2×2 power semiconductor devices 10, 3×3 power semiconductor devices 10, as an array of 4×4 power semiconductor devices 10 or even higher. m and n may be the same or different numbers. In that case, the electrically conductive plate 14 may be larger than 3 times or four times, respectively, the horizontal size of the power semiconductor devices 10 in directions parallel to rows and columns of the array. The horizontal size of the electrically conductive plate 14 may for example be in a range from about 0.5 mm to about 500 mm, e.g. from about 10 mm to about 100 mm, e.g. about 65 mm. In other embodiments, the arrangement of the plurality of power semiconductor devices 10 may have any shape and any number of power semiconductor devices 10, and the electrically conductive plate 14 may be shaped and dimensioned accordingly, i.e. with an arbitrarily (but suitably) shaped area that may be e.g. polygonal, e.g. quadratic or rectangular area, circular, or elliptical.

In various embodiments, the surface 14t of the electrically conductive plate 14 may be very planar. For example, no point of the surface 14t may deviate from an ideal plane by more than about 10 µm, e.g. by less than 8 µm. The second surface 14b opposite the surface 14t of electrically conductive plate 14 may be similarly planar. Furthermore, the surface 14t and the opposite surface 14b may be very parallel to each other. In various embodiments, an angle difference between the two surfaces may be small enough such that a thickness difference at various positions of electrically conductive plate 14 caused by the angle difference may be smaller than about 30 µm, e.g. smaller than about 20 µm, e.g. smaller than about 10 µm.

Each electrically conductive block 12 may have an arbitrary shape in the horizontal direction. It may, in various embodiments, be polygonal, e.g. rectangular, quadratic, basically quadratic with rounded corners and a cutout (as shown in the exemplary embodiment of FIG. 2A and FIG. 2B), round, elliptical, or of any other suitable shape.

In various embodiments, the plurality of electrically conductive blocks 12 and/or the electrically conductive plate 14 may have a coefficient of linear thermal expansion that may be as close as possible to the coefficient of linear thermal expansion of the semiconductor body, in order to achieve an adaptation of the coefficient of linear thermal expansion to the low coefficient of linear thermal expansion of the semiconductor body. By way of example, the plurality of electrically conductive blocks 12 and/or the electrically conductive plate 14, at a temperature of 20° C., may have a coefficient of linear thermal expansion of less than 11 ppm/K or even of less than 7 ppm/K. In this case, the plurality of electrically conductive blocks 12 and/or the electrically conductive plate 14 may for example consist of one of the following materials or include one of the following constructions: molybdenum; a metal matrix composite material (MMC), for example AlSiC (aluminum silicon carbide); a multilayer material comprising two or more metal layers, for example a three-layer material having the layer sequence copper-molybdenum-copper (Cu—Mo—Cu), e.g. having layer thicknesses in the ratio of 1:4:1, which produces a coefficient of expansion of the Cu—Mo—Cu three-layer material of approximately 7.3 ppm/K.

In various embodiments, the plurality of electrically conductive blocks 12 and/or the electrically conductive plate 14 may have a coefficient of linear thermal expansion that is the same as the coefficient of linear thermal expansion of the first controlled terminal and the second controlled terminal, e.g. the plurality of electrically conductive blocks 12 and/or the electrically conductive plate 14 may consist of the same material as the first controlled terminal and the second controlled terminal, e.g. copper.

In general, in various embodiments, the electrically conductive plate 14 and/or the plurality of electrically conductive blocks 12 may include or consist of a pure metal or a metal alloy, e.g. molybdenum, copper, thick deposited copper, silver, aluminum, gold, copper-molybdenum alloy, copper-silver-alloy, copper-zinc-alloy, or copper-tin-alloy, or of a combination of metals and/or metal alloys, e.g. a layered arrangement like the above described three-layer material or a metal or metal alloy coated with a different metal or metal alloy, e.g. molybdenum coated with ruthenium and silver, or the electrically conductive plate 14 and/or the plurality of electrically conductive blocks 12 may include or consist of a composite material including a metal and a non-metal, wherein the non-metal may for example be or include a carbon allotrope, e.g. graphite, graphene, diamond or carbon nanotubes, or a ceramic like e.g. silicon carbide, silicon nitride, boron, or aluminum oxide, aluminum nitride.

In various embodiments, the electrical conductivity of the material(s) of the electrically conductive plate 14 and/or the plurality of electrically conductive blocks 12 may be higher than about $1 \times 10^6$ S/m, e.g. higher than about $5 \times 10^6$ S/m, e.g. higher than about $1 \times 10^7$ S/m.

In various embodiments, the thermal conductivity of the material(s) of the electrically conductive plate 14 and/or the plurality of electrically conductive blocks 12 may be higher than about 35 W/mK, e.g. higher than about 100 W/mK, e.g. higher than about 400 W/mK.

In various embodiments, the top connecting layer may be embodied for example as an arbitrary solder layer, in particular also as a diffusion solder layer, e.g. a diffusion solder using a copper-zinc-paste or a tin paste, as a sintered layer containing a sintered metal powder (e.g. silver powder, copper powder or silver flakes, wherein the silver may have an electrical conductivity of about $61 \times 10^6$ S/m and a thermal conductivity of about 430 W/mK, and copper may have an electrical conductivity of about $58 \times 10^6$ S/m and a thermal conductivity of about 400 W/mK,), or an electrically conductive adhesive layer. Independently thereof, the bottom connecting layer may also be embodied as an arbitrary solder layer, in particular also as a diffusion solder layer, as a sintered layer containing a sintered metal powder (e.g. silver powder or silver flakes), or an electrically conductive adhesive layer. The top connecting layer and the bottom connecting layer may consist of the same material. Alternatively, arbitrary combinations of the materials mentioned for the two layers may be used for the top connecting layer and the bottom connecting layer, respectively.

In various embodiments, in order to produce the connections, a basic material for forming the top connecting layer and the bottom connecting layer, also referred to as the connecting layers, e.g. a solder paste, a diffusion solder, an adhesive paste or a sinter material, may be applied to the first controlled terminal and/or to the second controlled terminal and/or to the electrically conductive plate 14 and/or to the plurality of electrically conductive blocks 12, for example by screen or stencil printing, or the basic material for forming the connecting layer may be introduced in the form of a prefabricated solder lamina ("preform solder") between the plurality of electrically conductive blocks 12 and the second controlled terminal and respectively between the electrically conductive plate 14 and the first controlled terminal. In any case the solder paste or the solder lamina for producing the connections explained are melted and subsequently cooled, such that a cohesive connection in each case arises between the plurality of electrically conductive blocks 12 and the second controlled terminal and respectively between the electrically conductive plate 14 and the first controlled terminal.

In the case of the connecting layers including or consisting of a sintered layer, the basic material may be a paste, also referred to as a sinter paste, containing a metal powder (e.g. silver powder or silver flakes) and a solvent. In order to produce the connections, the sinter paste may be applied, for example, to the first controlled terminal and/or to the second controlled terminal and/or to the electrically conductive plate 14 and/or to the plurality of electrically conductive blocks 12, for example by screen or stencil printing. A sinter paste layer formed from the paste may thereby be arranged between the second controlled terminal and the plurality of electrically conductive blocks 12, and may make contact with each of them. In the case of a connecting layer embodied as an electrically conductive adhesive layer, the basic material on which said layer may be based may be embodied as an electrically conductive adhesive. In order to produce the connections, the adhesive may be applied, for example, to the first controlled terminal and/or to the second controlled terminal and/or to the electrically conductive plate 14 and/or to the plurality of electrically conductive blocks 12, for example by screen or stencil printing. A top adhesive layer formed from the adhesive may thereby be arranged between the second controlled terminal and the plurality of electrically conductive blocks 12 and may make contact with each of them. As a result of the subsequent curing, the electrically conductive top connecting layer may be formed from the top adhesive layer. Correspondingly, a bottom adhesive layer formed from an adhesive may be arranged between the first controlled terminal and the electrically conductive plate 14 and may make contact with the electrically conductive plate 14. As a result of the subsequent curing, the electrically conductive bottom connecting layer may be formed from the bottom adhesive layer.

If the electrically conductive piece is provided, it can be a material bonded to the control terminal by any of the connecting techniques such as have already been explained for the connection between the plurality of electrically conductive blocks 12 and the second controlled terminal, independently of the connecting technique chosen for the connection between the plurality of electrically conductive blocks 12 and the second controlled terminal.

In various embodiments, a control terminal interconnection structure 16 may be arranged on or in the solid composite, and may electrically conductively connect the control terminals of the power semiconductor devices 10 to one another. An encapsulation material 18 may, in various embodiments, directly adjoin the semiconductor body, i.e. the semiconductor material of the semiconductor body, and be material bonded to the semiconductor body.

In various embodiments, the encapsulation material 18 may enclose each of the power semiconductor devices laterally circumferentially in a ring-shaped fashion in such a way that the side of each of the electrically conductive blocks 12 which faces away from the respective power semiconductor device 10, also referred to as the top side of each of the electrically conductive blocks 12, which may include the top surface 12t (see FIG. 2E) of each of the electrically conductive blocks 12, may be not or at least not completely covered by the encapsulation material 18. The top surface 12t of each of the plurality of electrically conductive blocks 12 may thus be at least partially free from the encapsulation material 18, at least after grinding of the semiconductor arrangement 19 from a side of the top surface 12t. The side of the semiconductor arrangement 19 on which the top surface 12t is located may also be referred to as the top side of the semiconductor arrangement 19, and the opposite side of the semiconductor arrangement 19 may be referred to as the bottom side of the semiconductor arrangement 19.

In various embodiments, the control terminal interconnection structure 16 may be applied to the composite, and may electrically conductively connect the control terminals of the power semiconductor devices 10 to one another.

In various embodiments, for producing the semiconductor arrangement 19, the plurality of power semiconductor devices 10, each of which may have a semiconductor body and, as explained, may be equipped with an electrically conductive block 12, and optionally with an electrically conductive piece, are then placed alongside one another onto the electrically conductive plate 14.

The placement of the power semiconductor devices 10 on the electrically conductive plate 10 may be carried out such that they are situated in predefined positions relative to one another. The power semiconductor devices 10 may be connected to the electrically conductive plate 14, e.g. fixed in their respective predefined positions, using the connection layer as described above.

Figure 2C:
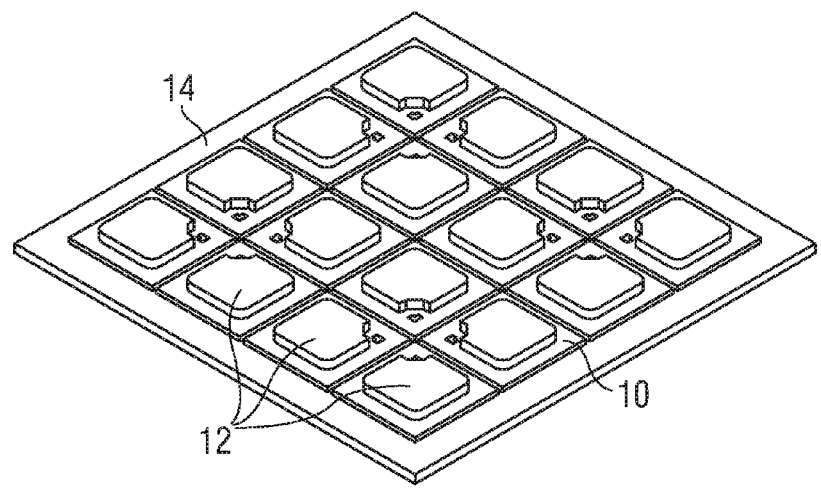
Figure 2C:
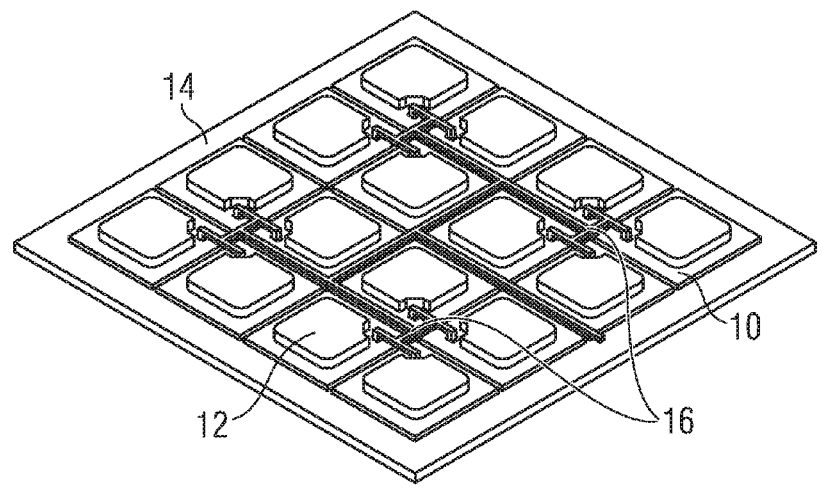

FIGS. 2A to 2H show semiconductor arrangements according to various embodiments during different stages of their manufacture. FIG. 2A to FIG. 2C show perspective views, FIG. 2D to FIG. 2H show cross-sectional views. The semiconductor arrangements of FIGS. 2A to 2H may be identical or similar to the semiconductor arrangement 19 of FIG. 1A to 1C. Methods of forming the semiconductor arrangement 19 according to various embodiments may be visualized by FIGS. 2A to 2H.

In various embodiments, as shown in FIG. 2A and FIG. 2B, the plurality of power semiconductor devices 10 may be arranged in the predefined positions relative to one another on the surface 14t of the electrically conductive plate 14, which may also be referred to as the bottom plate, during a so-called first attach process. Then, the power semiconductor devices 10, e.g. the chips or dies, may be connected as described above, e.g. sintered, soldered, glued, or the like, to the electrically conductive plate 14, which may include or consist of molybdenum or any other electrically conductive material as described above, in their respective predefined positions, using the connection layer, e.g. a layer of sinter material, e.g. sinter paste, as described above.

The plurality of electrically conductive blocks 12, which may include or consist of molybdenum or any other electrically conductive material as described above, may be arranged on the plurality of power semiconductor devices 10 during a second attach process. On each of the plurality of power semiconductor devices 10, an electrically conductive block 12 may be arranged. Then, the electrically conductive blocks 12 may be connected as described above, e.g. sintered, soldered, glued or the like, to the semiconductor devices 10.

In various embodiments, as shown in FIG. 2C, an optional so-called third attach process may be carried out for arranging the control terminal interconnection structure 16 described above, which may also be referred to as gate layer. It may for example be a common gate layer, e.g. a buried gate layer that may be arranged before the encapsulating of the semiconductor devices 10 in such a way that it may be partially, e.g. essentially completely, buried within the encapsulation material 18, or a so-called top gate layer that may be arranged on the encapsulation material 18 after the encapsulating of the semiconductor devices. An electrically conductive connection between the control terminal and the top gate layer may for example be achieved by forming an electrically conductive via in the encapsulation material 18 between the control terminal and the control terminal interconnection structure 16, e.g. by including pins for forming the vias in the semiconductor arrangement 19 before applying the encapsulation material 18, and thereafter removing the encapsulation material 18 above the pins, such that they are exposed for being electrically contacted, e.g. by a control terminal interconnect structure to be formed on the encapsulation material 18. Each control terminal of the plurality of control terminals may be connected as described above, e.g. using sintering, to an electrically conductive piece of the plurality of electrically conductive pieces, which may include molybdenum and/or any other suitable electrically conductive material, for example the materials described as suitable for the electrically conductive plate 14 and the plurality of electrically conductive blocks 12, arranged over the plurality of control terminals.

Figure 2D:
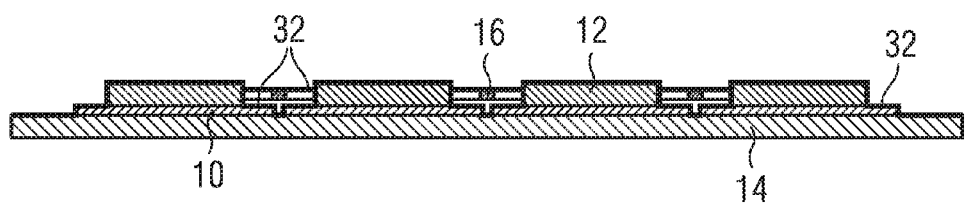

In various embodiments, as shown in FIG. 2D, on surfaces of the semiconductor arrangement 19 to be in direct contact with the encapsulation material 18, an adhesion promoter 32 may optionally be applied, e.g. deposited. The adhesion promoter 32 may serve to improve an adhesion between the encapsulation material 18 and the material it may adhere to, e.g. the electrically conductive material(s) of the electrically conductive plate 14 and of the plurality of electrically conductive blocks 12, and the material(s) of the plurality of power semiconductor devices 10, e.g. the semiconductor body and/or the metal of the terminals. Any suitable adhesion promoter 32 known in the art may be used, e.g. zinc chromate.

In various embodiments, surfaces or portions of surfaces of the semiconductor arrangement 19 not to come into contact with the encapsulation material 18 may be left free from the adhesion promoter 32. These surfaces or portions of surfaces may for example be masked or covered during the application of the adhesion promoter 32. In FIG. 2D, the top surfaces 12t of the plurality of electrically conductive blocks 12 and the bottom surface 14b of the electrically conductive plate 14 remain free from the adhesion promoter 32. Otherwise, on the surfaces or the portions of surfaces that are not covered by the encapsulation material 18, and that may be exposed to oxygen, e.g. atmospheric oxygen, at least some adhesion promoters 32, e.g. zinc chromate, may react to form an oxide, which may be electrically insulating.

As shown in FIG. 2E, in various embodiments, after the power semiconductor devices 10 and the electrically conductive blocks 12 have been connected to the electrically conductive plate 14, and optionally the control terminal interconnection structure 16 been arranged and the adhesion promoter 32 been applied, the encapsulation material 18 may be applied over the power semiconductor devices 10 situated on the electrically conductive plate 14. In the top panel of FIG. 2E, the encapsulation material is designated as 18a, which is meant to express that at this stage, the encapsulation material may differ considerably from its final state. When the encapsulation material 18a is applied, it may for example include or consist of a powder, a granulate, micro-pellets, pellets, a sheet, or it may be liquid, whereas after curing, the encapsulation material 18 may be a solid structure.

In various embodiments, the encapsulation material 18, 18a, which may be dielectric at least in the cured state, may have the effect that the power semiconductor devices 10 are fixedly and material bonded to one another and to the electrically conductive plate 14. Examples of a suitable encapsulation material include polymers with a high extent of cross-linking, e.g. epoxy, silicone, cyanate esters, bismaleimids (BMI) or polyimides, or a mixture of said polymers, e.g. epoxy silicone or epoxy-polyimide or other combinations. In various embodiments, the encapsulation material 18 may be a composite material including the mold component, e.g. as described above, and a filling component, which may be distributed, e.g. homogeneously, in the mold component. The filling component may for example include or consist of silicon dioxide or of particles with a high thermal conductivity, e.g., aluminum oxide, boron nitride, silicon nitride, aluminum nitride, or diamond. The filling component may help achieving a homogeneous temperature distribution on small spatial scales, and may thereby alleviate or avoid thermal stress in the encapsulation material 18. In principle, however, for all embodiments, any encapsulation materials 18a, 18 may be used, provided that they are dielectric in the cured state. The encapsulation material 18, 18a may for example be suitable for compression molding and/or for transfer molding, and/or at least the cured encapsulation material 18 may have a high temperature resistivity. In various embodiments, the encapsulation material 18 may be an insulating material with a high dielectric strength. In other words, a large voltage difference, e.g. several hundreds or several thousands of volts, may be applied to the electrically conductive plate 14 and the electrically conductive blocks 12 without the encapsulation material 18 breaking down, i.e. losing its insulating properties.

In various embodiments, as shown in the second panel of FIG. 2E, the encapsulation material 18a may be pressed against the electrically conductive plate 14 using a shaping device 44b, 44t, 87, e.g. a stamp, such that at least interspaces situated between respectively adjacent power semiconductor devices 10 and between adjacent electrically conductive blocks 12 may be filled with the encapsulation material 18a, 18. This process may be referred to as compression molding. For the compression molding, granulate or a liquid may be used for the encapsulation material 18a. An outer shape to be formed by the encapsulation material 18 may be defined by a cavity 44c formed in a top part 44t of the shaping device 44b, 44t, 87. The top part 44t may include or consist of several parts, e.g. a top cavity plate 44t2 and a clamp ring 44t1, e.g. a resin clamp ring 44t1, e.g. a spring-loaded clamp ring. Alternatively, the top cavity plate 44t2 may be spring loaded. Between the top cavity plate 44t1 and the resin clamp ring 44t, one or more vacuum channels 41 may be arranged. The vacuum channels 41 may be used for applying a vacuum to the cavity 44c, for example for arranging a releasing film 46 on a surface of the cavity 44c. The top part 44t of the shaping device 44b, 44t, 87, e.g.

the cavity 44c and an interface with the surface 14t of the electrically conductive plate 14, may be shaped in such a way that the edge region 14e of the electrically conductive plate 14 remains free from the encapsulation material 18. The edge region 14e may, in various embodiments, have a width in a range from about 200 μm to about 5 mm, e.g. about 1 mm or about 2 mm.

In various embodiments, the encapsulation material 18, 18a may be arranged in the cavity 44c. A volume of the encapsulation material 18a dispensed on the electrically conductive plate 14 may be such that the cavity 44c will at least be filled with encapsulation material 18 during the molding, thereby also covering the top surfaces 12t of the plurality of electrically conductive blocks 12.

In various embodiments, a releasing film 46 may be arranged between the top part 44t of the shaping device 44b, 44t, 87 and the encapsulation material 18, 18a. Thus, a contact between the top part 44t of the shaping device 44t, 44b, 87 and the encapsulation material 18 may be avoided. Thus, high adhesion material may be used as the encapsulation material 18. The releasing film 46 may facilitate a separating of the top part 44t of the shaping device 44t, 44b, 87 from the cured encapsulation material 18. Furthermore, no cleaning interval for cleaning the shaping device 44t, 44b, 87 may be necessary.

In various embodiments, the cavity 44c may be formed such that the encapsulation material 18, 18a may also be positioned on the top surfaces 12t of the plurality of electrically conductive blocks 12.

In various embodiments, the encapsulation material 18a may then be cured, such that the power semiconductor devices 10 embedded into the encapsulation material 18, together with the encapsulation material 18, the plurality of electrically conductive blocks 12 and the electrically conductive plate 14, form a solid composite. The shaping device 44b, 44t, 87 may be lifted off from the solid composite after the curing of the encapsulation material 18, 18a. The fourth panel of FIG. 2E shows the composite that may be achieved in various embodiments.

In various embodiments, a top cover layer 48 of the composite (in the fourth panel, the portion above the dashed line) may be removed from the composite. In other words, a top portion of the encapsulation material 18 and optionally of the plurality of electrically conductive blocks 12 may be removed, e.g. by grinding, polishing and/or lapping. Thereby, a top surface 19t of the composite—and thereby of the semiconductor arrangement 19—may be formed, including the top surfaces 12t of the plurality of electrically conductive blocks 12 and top surfaces 18t of the encapsulation material 18.

In various embodiments, the top surface 19t of the semiconductor arrangement 19 may be essentially parallel to the surface 14t and/or to the second surface 14b of the electrically conductive plate 14. The top surfaces 12t of the plurality of electrically conductive blocks 12 and top surfaces 18t of the encapsulation material 18 may in various embodiments be essentially flush with each other.

The removing of the top cover layer 48 may expose the plurality of electrically conductive blocks 12, i.e. the top surface 12t of the plurality of electrically conductive blocks 12. In other words, the side of the plurality of electrically conductive blocks 12 facing away from the semiconductor body 10 may not be covered or at least not completely covered by the encapsulation material 18, such that they may be electrically contacted.

Figure 2F:
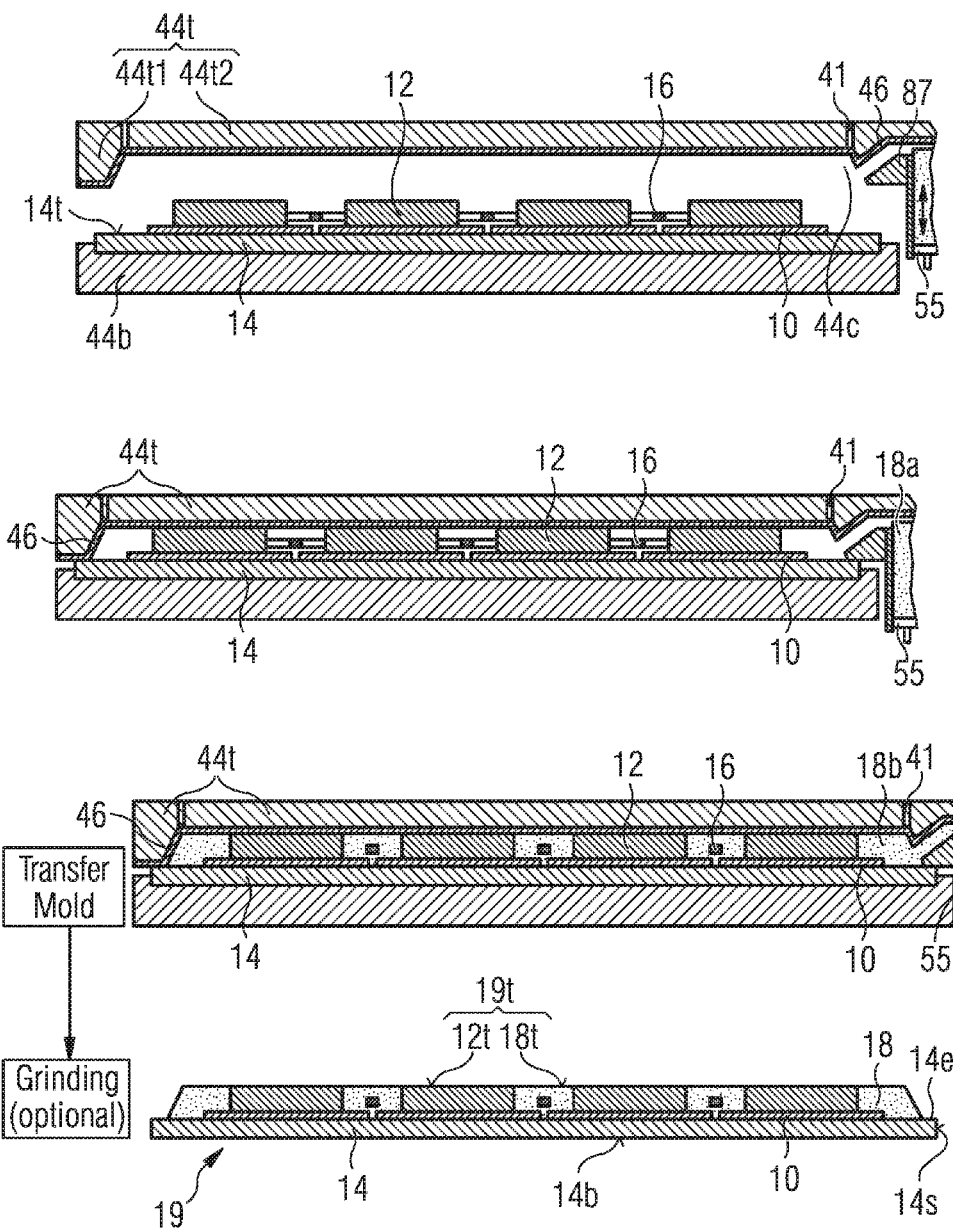

In various embodiments, at least one portion 12t of the top surface 19t of the semiconductor arrangement 19 opposite the electrically conductive plate 14 may be electrically coupled with the respective second controlled terminal of each power semiconductor device 10 of the plurality of power semiconductor devices 10. Thus, the plurality of power semiconductor devices 10 may be electrically contacted from the two opposite surfaces 19t, 14b, because the surfaces 19t, 14b may be (at least partially at the top surfaces 12t of the electrically conductive blocks in the case of the top surface 19t) electrically conductive and electrically conductively connected to respective terminals of the plurality of semiconductor devices 10. The exposing of the electrically conductive portion of the top surface, i.e. the top surface 12t of the plurality of electrically conductive blocks 12, may not necessarily be exposed by grinding, as shown in FIG. 2E, but also by other processes, for example by using transfer molding as shown in FIG. 2F.

In various embodiments, the semiconductor arrangement 19 may be configured to have a current flowing between the at least one portion 12t of the top surface 19t and the electrically conductive plate 14, for example the bottom surface 14b of the electrically conductive plate. The current may be a main current. The (e.g. main) current flowing essentially or completely between the two (e.g. main) surfaces 12t and 14b of the semiconductor arrangement 19 may also be referred to as a vertical current.

As a result of the removal of the top cover layer 48, the thickness of the plurality of electrically conductive blocks 12 may be reduced compared with their original thickness, for example by approximately 0.1 mm. The same correspondingly applies, if applicable, to the thickness of the electrically conductive piece in comparison with the original thickness thereof.

As can be seen in the perspective views of FIG. 1A, the plurality of electrically conductive blocks 12 may be surrounded by the encapsulation material 18 in a ring-shaped fashion. The same may apply to the plurality of power semiconductor devices 10, which may be visualized by FIG. 1A, which shows the semiconductor arrangement of FIG. 1A with the encapsulation material 18 removed.

In various embodiments, the encapsulation material 18 may firstly serve to fixedly connect the individual power semiconductor devices 10 to one another, but secondly also to ensure the insulation strength of the power semiconductor devices 10. In order to ensure a sufficient insulation strength between directly adjacent power semiconductor devices 10 in the completed semiconductor arrangement 19, the encapsulation material 19 may have a minimum horizontal width W1, i.e. a minimum width W1 parallel to the surface 14t of the electrically conductive plate 14 and/or parallel to the top surfaces 12t, 18t, 19t of the electrically conductive blocks 12, the encapsulation material 18 and/or the semiconductor arrangement 19 between the lateral edges of the adjacent power semiconductor devices 10. The minimum width W1 may, in various embodiments, be at least 100 μm, e.g. at least 2 mm or at least 5 mm.

The process shown in FIG. 2F for forming the semiconductor arrangement may be largely similar or partially identical to the process of FIG. 2E. Thus, only differences to the process shown in FIG. 2E will be described.

In various embodiments, the electrically conductive plate 14 with the plurality of power semiconductor devices 10, the plurality of electrically conductive blocks 12 and the (optional) control terminal interconnection structure 16 may be arranged in the shaping device 44b, 44t, 87. The shaping device 44b, 44t, 87 may remain stationary during a shaping process of the encapsulation material 18 around the plurality of semiconductor devices 10. In other words, the shaping device 44b, 44t, 87 may not have or use a stamp functionality during the shaping process, but define a shape to be formed by the encapsulation material 18. The releasing film 46 arranged between the plurality of electrically conductive blocks 12 and the top part of the shaping device 44b, 44t, 87 may contact, e.g. may be pressed on, the top surface 12t of the plurality of electrically conductive blocks 12.

In various embodiments, the encapsulation material 18a may only then be introduced, e.g. pushed in by a plunger 55 of a filling device as shown in FIG. 2F, into the cavity 44c formed between the top part 44t of the shaping device 44b, 44t, 87 and the electrically conductive plate 14, for example through an opening between the top part 44t of the shaping device 44b, 44t, 87 and a part 87 of the shaping device, a so-called top-edge gate, arranged on the electrically conductive plate 14. The encapsulation material 18 may be cured subsequently, whereby the solid integral encapsulation material 18 may be formed. After a removal of the shaping device 44t, 44b, 87 and of the part 87, the edge 14e of the electrically conductive plate 14 may be exposed, i.e. it may be free from encapsulation material 18. This process may be referred to as transfer molding. Pellet-shaped encapsulation material 18a may in various embodiments be used for the transfer molding.

The volume of the encapsulation material 18a dispensed on the electrically conductive plate 14 may also in case of the transfer molding be such that the cavity 44c will at least be filled with encapsulation material 18 during the molding. Air trapped in the cavity 44c may escape through at least one air vent 65 (see FIG. 3B), and/or a vacuum may be applied before filling in the encapsulation material 18a.

In various embodiments, vacuum may also be used for sucking the releasing film 46 and/or the semiconductor arrangement 19 to the shaping device 44b, 44t, 87.

The term "top part of the shaping device" etc. is used to describe the orientation as shown in the respective Figures. However, an arrangement of the shaping device 44b, 44t, 87 (and other relevant parts used for encapsulating) may for example be inverted, in other words, the part of the shaping device 44b, 44t, 87 having the cavity may be arranged below the other part, i.e. as a bottom cavity plate.

The encapsulation material 18 may, in various embodiments, be formed in such a way that no encapsulation material 18 is formed on the top surface 12t of the plurality of electrically conductive blocks 12. In various embodiments, for example in a case of the releasing film 46 being thick, e.g. 100 µm or more, and soft, the top surface 12t of the plurality of electrically conductive blocks 12 may even be pressed into the releasing film 46, such that, after the molding, the top surfaces 12t of the plurality of electrically conductive blocks 12 may protrude somewhat from the encapsulation material 18. Otherwise, the top surface 12t of the plurality of electrically conductive blocks 12 may for example be flush with the top surface 18t of the encapsulation material 18. As a consequence, a grinding of the resulting semiconductor arrangement may be obsolete. This may not only save processing time, but it may also allow using coated electrically conductive blocks 12 for which the coating may still be present after the molding process, because the top cover layer 48 as shown in FIG. 2E, which may also include a portion of the electrically conductive blocks 12, need not be removed.

In various embodiments, as e.g. shown in FIG. 2E and FIG. 2F, the semiconductor arrangement 19 may include a control terminal interconnection structure 16, which may serve to electrically conductively connect the control terminals of the plurality of power semiconductor devices 10 to one another. The control terminal interconnection structure 16 may be produced by a wide variety of technologies. The control terminal interconnection structure may be electrically conductive or at least partially electrically conductive.

In various embodiments, the control terminal interconnection structure 16 may be placed onto the composite of the power semiconductor devices 10, the electrically conductive blocks 12, the electrically conductive plate 14 and the encapsulation material 18 as a prefabricated element, for example as a printed circuit board or as a wire grid, and may optionally be material bonded to the composite. The prefabricated element of the control terminal interconnection structure 16 may, in various embodiments, be arranged at a level below a level of the top surface 12t of the plurality of electrically conductive blocks 12. Thereby, after the molding process, the control terminal interconnection structure 16 may be enclosed within the encapsulation material 18 as shown in, e.g., FIG. 2E and FIG. 2F.

In various embodiments, the control terminal interconnection structure 16 may be constructed on the composite.

In various embodiments, the control terminal interconnection structure 16 may be implemented for example by the deposition of an electrically conductive material, for example a metal or a doped polycrystalline semiconductor material, onto the composite using thin-film technology, e.g. a chemical and/or physical deposition method such as e.g. physical vapor deposition (PVD) or chemical vapor deposition (CVD), by sputtering or by electrical or electroless plating. The completed deposited control terminal interconnection structure 16 may for example have a thickness in a range from below 1 µm to about 100 µm, e.g. from about 5 µm to about 20 µm or from about 30 µm to about 100 µm.

In various embodiments, a closed layer of the electrically conductive material may be formed on the composite and then structured, for example photolithographically by means of a mask. In various embodiments, a mask layer may be formed first on the composite, to then structure the mask layer such that it has openings, and then to deposit the electrically conductive material on the structured mask layer, such that the electrically conductive material may be formed on the composite in regions of the mask openings, and may electrically conductively connect the control terminals.

In a case of the control terminal interconnection structure 16 being enclosed, e.g. by the encapsulation material 18, in order to be able to make electrical contact with the control terminals, the control terminals covered by the encapsulation material may be exposed. In principle, any desired techniques may be used for this purpose. One of these techniques may be a removing the encapsulation material 18 above the control terminals by laser beam to an extent such that the encapsulation material 18 may have cutouts.

In various embodiments, the control terminal and/or the control terminal interconnection structure 16 may be formed on a top of the encapsulation material 18.

In various embodiments, a dielectric layer may optionally be formed on the control terminal interconnection structure 16 in order to electrically insulate the latter from the plurality of electrically conductive blocks 12. Such a dielectric layer may be applied by any suitable technique. By way of example, a dielectric material may be applied by deposition (e.g. PVD or CVD or sputtering) onto the control terminal interconnection structure 16. It may be likewise possible to place or adhesively bond a stamped dielectric plate or a dielectric film onto the control terminal interconnection structure 16.

Figure 3A:
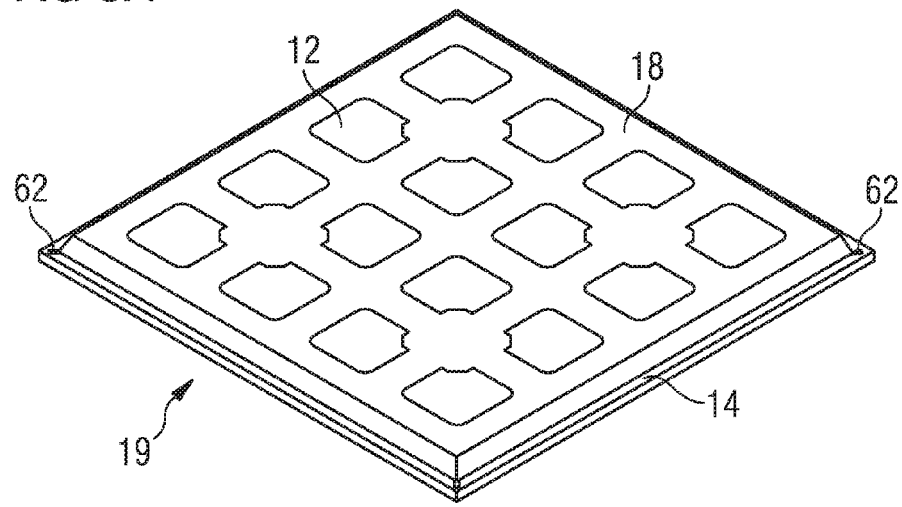
FIGS. 3A and 3B show perspective views of a semiconductor arrangement according to various embodiments during different stages of its manufacture.
Figure 3B:
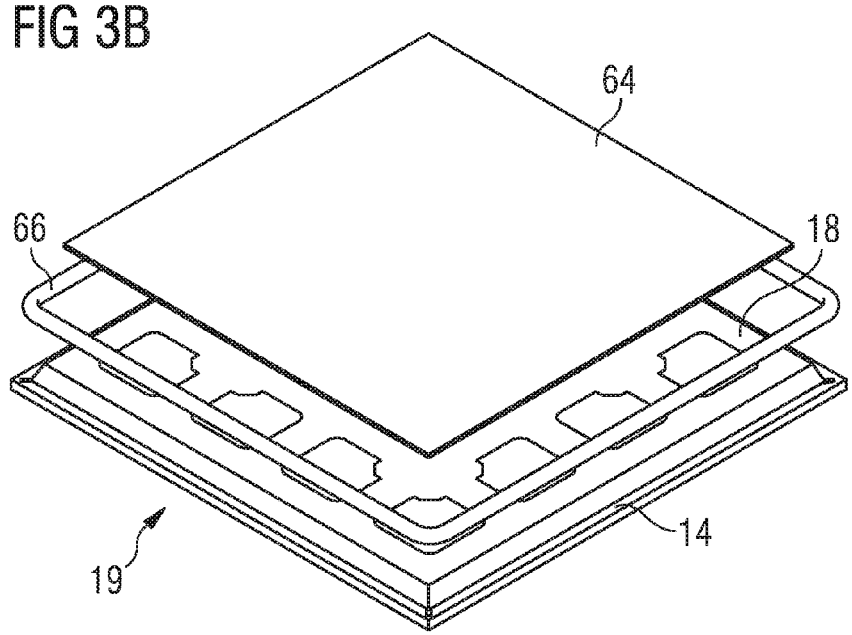
Figure 5:
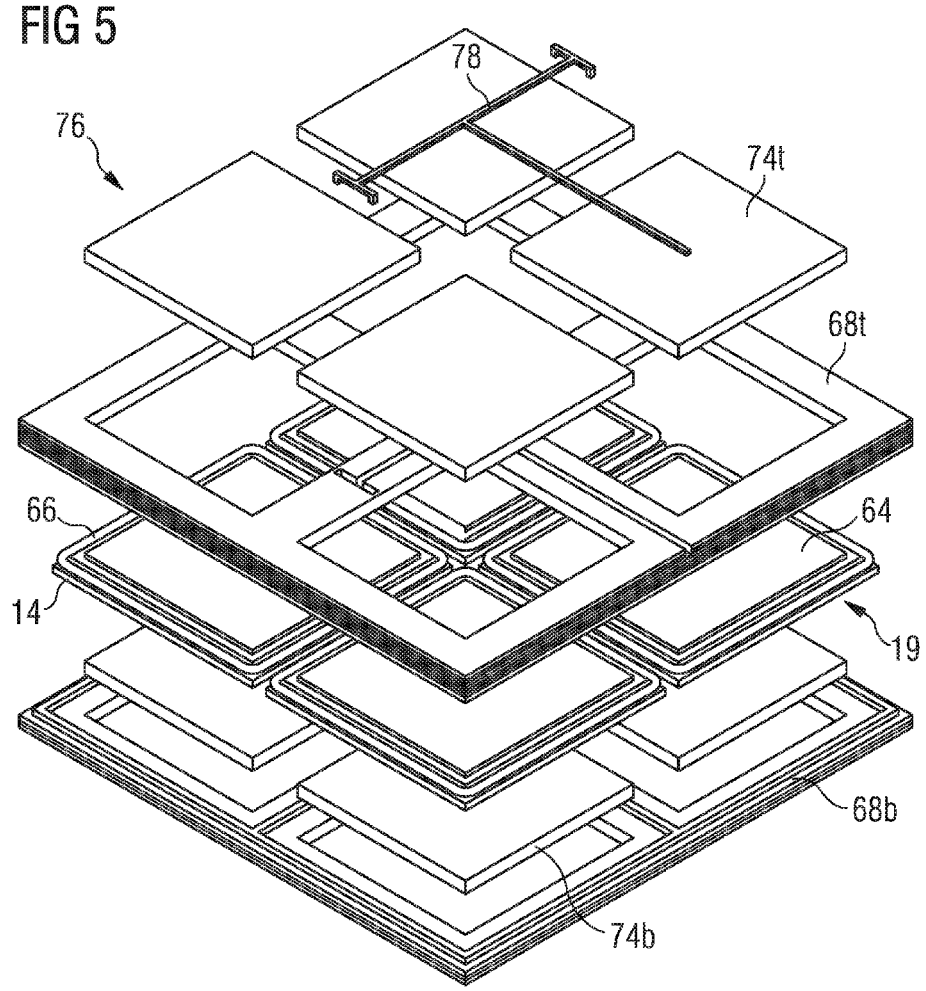
FIG. 5 shows a semiconductor system according to various embodiments, as an exploded view at the top and as perspective view at the bottom.
Figure 5:
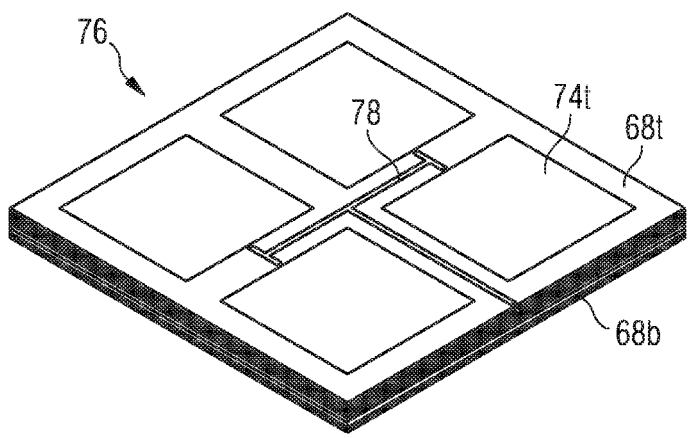

The dielectric layer may be formed as a prefabricated layer provided with cutouts which may be applied to the composite with the control terminal interconnection structure 16 in such a way that the cutouts are arranged above the plurality of electrically conductive blocks 12, and contact may be made (e.g. by an electrically conductive layer, e.g. a metal layer 64, see FIG. 3B, and/or by a contact plate 74*t*, see FIG. 5) with the electrically conductive blocks 12 through the dielectric layer and the control terminal interconnection structure 16.

In various embodiments the dielectric layer may be applied differently, e.g. as a closed layer to the composite provided with the control terminal interconnection structure 16, such that the closed layer covers the control terminal interconnection structure 16 and plurality of electrically conductive blocks 12, and then to form the cutouts through which the electrical contact may be made with the electrically conductive blocs 12 and with the control terminal interconnection structure 16, or by forming the dielectric layer already in structured form on the composite.

Figure 2G:
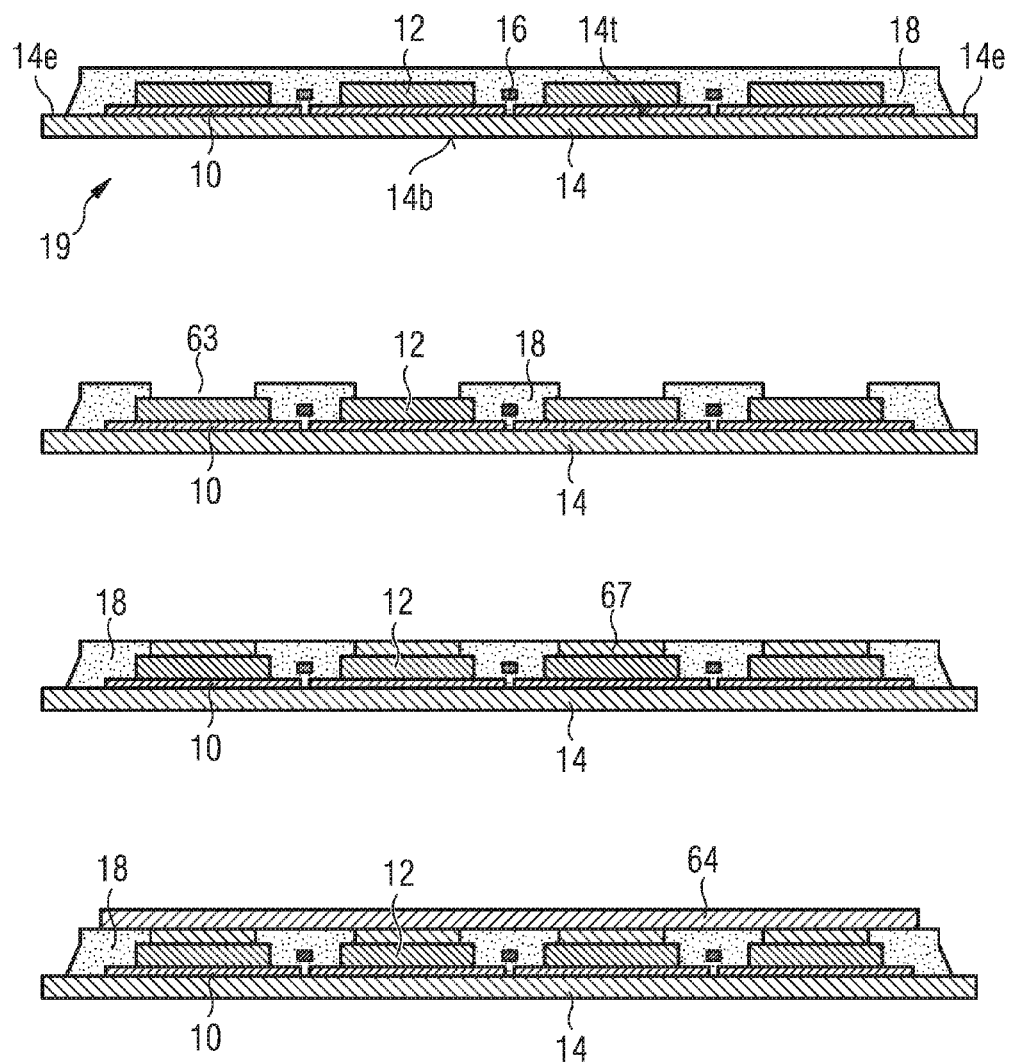

The process shown in FIG. 2G for forming the semiconductor arrangement may be largely similar or partially identical to the process of FIG. 2E or 2F. Thus, only differences to the process shown in FIG. 2E or 2F will be described.

As may be seen in the top panel of FIG. 2G, the dielectric material 18 may be formed also above the plurality of electrically conductive blocks 12. Subsequently, as shown in the second panel of FIG. 2G, a plurality of cavities 63 may be formed in the dielectric material 18, e.g. by laser ablation or by etching. For example, one cavity 63 may be formed above each electrically conductive block 12. The cavities 63 may, in a horizontal direction, be almost as large as the electrically conductive blocks 12. The cavities 63 may be filled with an electrically conductive material 67, e.g. by an electrically conductive paste, e.g. sinter or glue, galvanic plating, plasma dust, laser sintering or a metal sheet.

In various embodiments, the electrically conductive material 67 may be arranged to not only fill the cavities 63, but to also form a layer above the encapsulation material 18 and the cavities 63 filled with the electrically conductive material 67. In that case, the electrically conductive material 67 may be considered to form the electrically conductive layer, e.g. the metal layer 64. The electrically conductive material 67 may for example be an electrically conductive paste that is arranged as described.

Figure 2H:
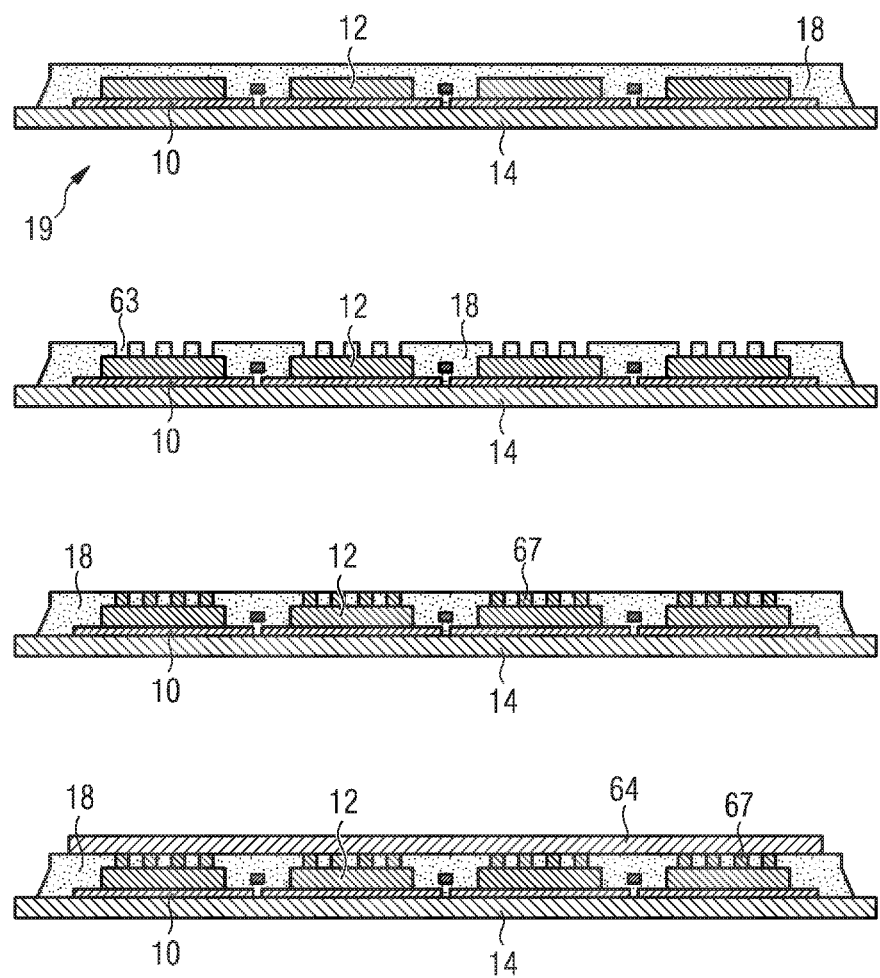

The process shown in FIG. 2H for forming the semiconductor arrangement may be largely similar or partially identical to the process of FIG. 2G. Thus, only differences to the process shown in FIG. 2G will be described.

In various embodiments, rather than forming one relatively large cavity 63 above each of the electrically conductive blocks 12, a plurality of smaller cavities 63 may be formed in the encapsulation material 18 above each of the electrically conductive blocks 12.

FIGS. 3A and 3B show perspective views of a semiconductor arrangement 19 according to various embodiments during different stages of its manufacture.

In various embodiments, the semiconductor arrangement 19 shown in FIG. 3A may be similar or identical to the semiconductor arrangement 19 described above. Duplicate descriptions may therefore be omitted.

Figure 4A:
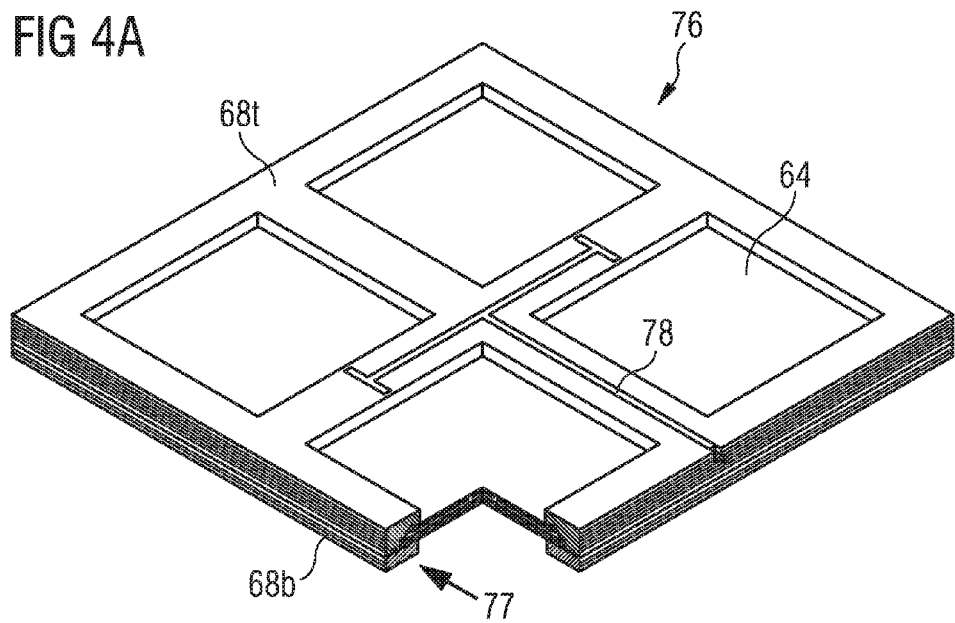
FIG. 4A to 4E show a perspective view (FIG. 4A) and cross-sectional views (FIG. 4B to 4E) of a semiconductor arrangement according to various embodiments with a sealing structure.
Figure 4B:
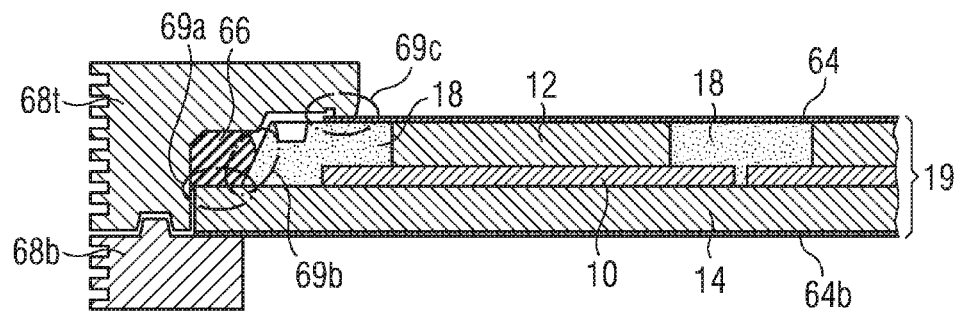

As shown in FIGS. 4A and 4B, the semiconductor arrangement 19 may further be provided with a sealing structure 66, 68*b*, 68*t*. The sealing structure 66, 68*b*, 68*t* may be part of an hermetic sealing of the power semiconductor arrangement 19 from potentially harmful substances, e.g. from humidity, liquid and/or chemicals.

As shown in FIGS. 3B, 4A and 4B, in various embodiments, the sealing structure 66, 68*b*, 68*t* may include a sealing element 66, e.g. a sealing ring. The sealing element 66 may be arranged on the surface 14*t* of the electrically conductive plate 14, e.g. on the edge region 14*e* free from the encapsulation material 18. The sealing element 66 may be in, e.g. physical, contact with both the electrically conductive plate 14 and the encapsulation material 18, as shown in FIG. 4B. Thereby, a contact region where the encapsulation material 18 may contact the electrically conductive plate 14 may be sealed off from an outside, e.g. from humidity, liquids and/or chemicals. In other words, whereas the semiconductor arrangement of the prior art may provide a path between the encapsulation material 18 and the electrically conductive plate 14 along which e.g. humidity may enter the semiconductor arrangement 19, e.g. reach the plurality of power semiconductor devices, the semiconductor arrangement 19 according to various embodiments may seal such a path using a sealing element. The edge 14*e*, e.g. the surface 14*t* at the edge 14*e*, of the electrically conductive plate 14 protruding horizontally beyond the encapsulation material 18, may provide a suitable location for arranging the sealing element 66. By arranging the sealing element 66 on the edge 14*e* of the electrically conductive plate 14, a surface distance, and thereby a creeping distance, between the electrically conductive plate 14 and the plurality of electrically conductive blocks 12 may be increased.

In various embodiments, in addition, the sealing element 66 may be pressed in place by a holding portion 68*t*, 68*b* of the sealing structure 66, 68*b*, 68*t*. The holding portion 68*b*, 68*t* may in various embodiments include a top portion 68*t* and a bottom portion 68*b*. The top portion 68*t* and the bottom portion 68*b* may, in various embodiments, be formed and arranged in such a way that they may be separated from each other. This may allow an easy positioning of the semiconductor arrangement 19 in the holding portion 68*b*, 68*t*, and it may further allow the holding portion 68*t*, 68*b* to press on the sealing element 66.

In various embodiments, the sealing element 66 may be arranged in a ring-like fashion. As described above, this may refer to the sealing element 66 forming a closed structure, i.e. of not having an opening, in the exemplary embodiment shown in FIG. 3B, in a horizontal plane. This may in various embodiments be achieved by arranging a pre-formed ring-shaped sealing element 66, e.g. a sealing ring, on the edge region 14*e* of the semiconductor arrangement 19. In various embodiments, the pre-formed sealing element 66 may not be ring-shaped yet before it is arranged on the edge region 14*e* of the semiconductor arrangement 19. Instead, an e.g. elongated sealing element 66 may be arranged on the edge region 14*e* of the semiconductor arrangement 19 surrounding the encapsulation material 18 with a first and a second end of the sealing element 66 overlapping. The sealing element 66 may then act as a ring-like (closed) sealing element 66 during operation of the semiconductor arrangement 19, e.g. by pressing the sealing element 66, e.g. the ends of the sealing element 66, or by e.g. closing the ends of the sealing element 66 using e.g. an adhesive. In various embodiments, the sealing element 66 may be formed on the semiconductor arrangement 19. For example, a suitable material, e.g. silicone, may be arranged, e.g. in a ring-like fashion, on the semiconductor arrangement 19, e.g. on the edge region 14*e* of the semiconductor arrangement.

In various embodiments, the sealing element 66 may include or consist of an elastic material. Furthermore, the elastic material may have a high temperature resistance. For example, it may withstand processing temperatures of about 150° C. or more, e.g. of about 200° C. or more.

In various embodiments, the elastic sealing element 66 may include palex, high temperature silicone rubber, Ecraz, Kalez®, and Viton®.

In various embodiments, as shown in FIG. 3B, the semiconductor arrangement 19 may further include an electrically conductive layer, e.g. a metal layer 64. The electrically conductive layer 64 may be arranged over the top surface 19t of the semiconductor arrangement 19. Thereby, the electrically conductive layer may seal connection areas between the encapsulation material 18 and the electrically conductive blocks 12, such that no humidity, etc. may enter through those connection areas.

In various embodiments, the electrically conductive layer 64 may have a compressibility, in other words the electrically conductive layer 64 may serve as a compensation layer in a case of pressure being applied to the semiconductor arrangement 19. In yet other words, the electrically conductive layer 64 may serve as a kind of cushion or buffer. For example, the compressibility and a thickness of the electrically conductive layer 64 may be suitable for compensating thickness or height variations within the semiconductor arrangement 19 or between two or more semiconductor arrangements 19. This makes larger tolerances for the manufacture of the semiconductor arrangement(s) 19 possible while still guaranteeing its/their functionality.

In various embodiments, the electrically conductive layer 64, e.g. the metal layer 64, may include or consist of silver.

In various embodiments, the holding portion 68t, 68b may press the electrically conductive layer 64, e.g. an edge of the electrically conductive layer 64, towards the semiconductor arrangement 19. In various embodiments, the holding portion 68t, 68b may form a connection between the electrically conductive layer 64 and the sealing element 66. Thereby, the plurality of power semiconductor devices 10 may be hermetically sealed from an environment. In other words, no portion (e.g. harmful portion) of the environment may enter the semiconductor arrangement 19 and proceed towards the power semiconductor devices 10. In various embodiments, an additional electrically conductive layer 64b may be provided over the second surface 14b of the electrically conductive plate 14.

FIG. 4A to 4E show a perspective view (FIG. 4A) and cross-sectional views (FIG. 4B to 4E) of a semiconductor arrangement 19 according to various embodiments with a sealing structure 66, 68b, 68t.

As shown in FIG. 4A, the sealing structure 66, 68b, 68t may, in various embodiments, be formed in such a way that a semiconductor system 76 including a plurality of semiconductor arrangements 19 may be formed. The control terminal interconnection structure 16 of each of the semiconductor arrangements 19 may be electrically conductively connected by a second interconnection structure 78.

As shown in FIG. 4B, which shows a cross-sectional view of a portion of the semiconductor arrangement 19 of FIG. 4A as seen in the direction of the arrow 77, sealing regions 69a, 69b, 69c may be formed between the semiconductor arrangement 19 and the sealing structure 66, 68b, 68t, e.g. the sealing regions 69a (between the sealing element 66 and the electrically conductive plate 14), 69b (between the sealing element 66 and the encapsulation material 18) and 69c (between the top portion 68t and the electrically conductive layer 64). Each of the sealing regions 69a, 69b, 69c may be regions in which the semiconductor arrangement 19 is sealed off from its environment, e.g. the atmosphere.

Figure 4C:
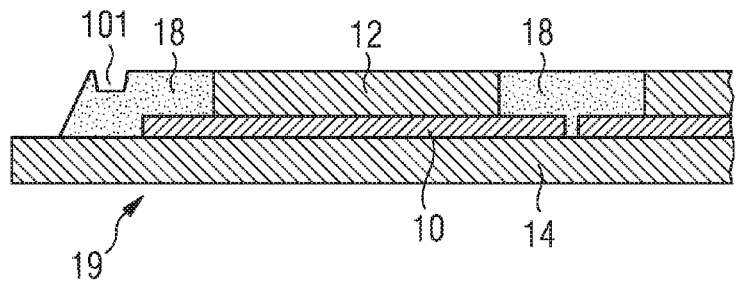

FIG. 4C shows a cross-sectional view of a semiconductor arrangement 19 according to various embodiments. It may differ from the semiconductor arrangement 19 of FIG. 4B mainly by an opening 101 formed in the encapsulation material 18 from the top surface 19t near an edge of the semiconductor arrangement 19. The opening 101 may in various embodiments be formed as a groove, e.g. a groove surrounding the semiconductor arrangement 19. The groove may increase a surface distance, for example the shortest distance along the surface, also referred to as the surface distance, between the electrically conductive blocks 12, or, more generally, the electrically conductive portion on the top surface 19t of the semiconductor arrangement 19 and the electrically conductive plate 14, and thereby increase a creeping distance between the two electrically conductive elements that may be at different electrical potentials. This may allow an increase in the difference between the electrical potentials and/or of the operating voltages.

Figure 4D:
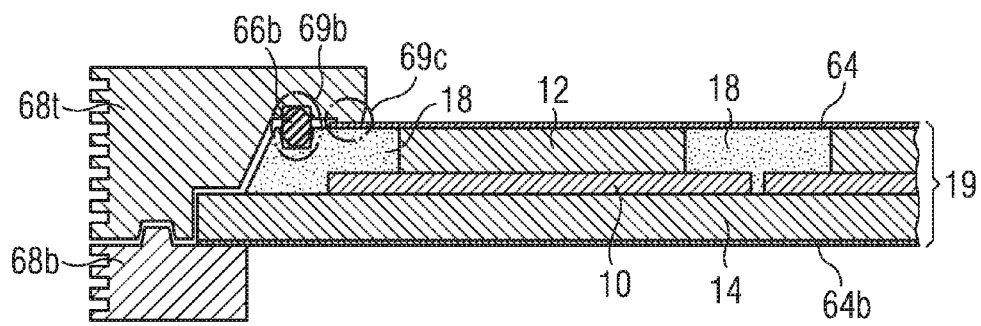

In various embodiments, as shown in FIG. 4D, a second sealing element 66b, e.g. a sealing ring, may be arranged in the opening 101. Similar to the sealing functionality described above for FIG. 4B, the second sealing element 66b may create a sealing region 69b between the sealing element 66 and the encapsulation material 18.

Figure 4E:
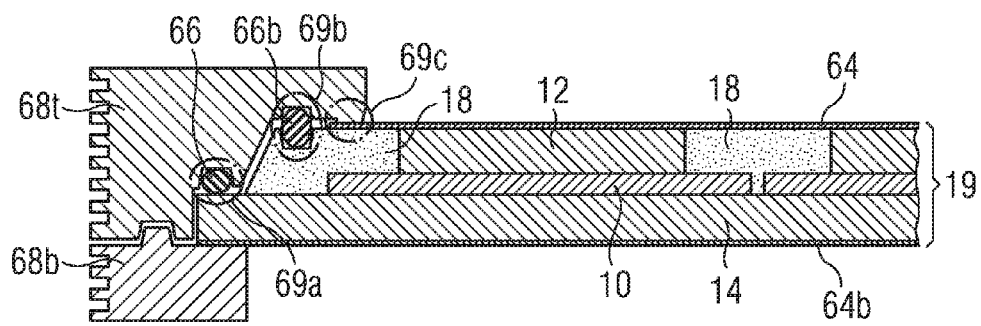

In various embodiments, as shown in FIG. 4E, both sealing elements 66 and 66b may be arranged, thereby forming the sealing regions 69a (between the sealing element 66 and the electrically conductive plate 14), 69b (between the sealing element 66 and the encapsulation material 18) and 69c (between the top portion 68t and the electrically conductive layer 64).

In various embodiments (not shown), the sealing element 66 and/or the sealing element 66b bay be imbedded in the encapsulation material 18.

FIG. 5 shows a semiconductor system 76 according to various embodiments, as an exploded view at the top and as a perspective view at the bottom.

In order to enable an electrical operation of the semiconductor arrangement 19 explained above, the semiconductor arrangement 19 may be clamped in between an electrically conductive pair of contact plates 74t, 74b, e.g. a top contact plate 74t and a bottom contact plate 74b, in such a way that there may be a pressure contact between the top pressure contact plate 74t and the plurality of electrically conductive blocks 12, without the top pressure contact plate 74t and the plurality of electrically conductive blocks 12 being cohesively connected, and that there may be a pressure contact between the bottom pressure contact plate 74b and the electrically conductive plate 14, without the bottom pressure contact plate 74b and the electrically conductive plate 14 being cohesively connected. The top pressure contact plate 74t and the bottom pressure contact plate 74t may be connected to an electrical voltage source, such that different electrical potentials may be present at the top pressure contact plate 74t and the bottom pressure contact plate 74b.

In various embodiments, a plurality of semiconductor arrangements 19 may be combined into a semiconductor system 76. The constituents of the semiconductor system 76 shown in FIG. 5 are described above. They may interact to provide a pressure contact, exerted, e.g., by the pair of contact plates 74t, 74b.

FIG. 6 shows a diagram 600 illustrating a method of forming a semiconductor arrangement in accordance with various embodiments.

In various embodiments, the method may include arranging a plurality of power semiconductor devices on a surface of a electrically conductive plate (in 601).

It may further involve electrically coupling a first controlled terminal of each power semiconductor device of the plurality of power semiconductor devices to the electrically conductive plate (in 602), electrically coupling each electrically conductive block of a plurality of electrically conductive blocks with a respective second controlled terminal of each power semiconductor device of the plurality of power semiconductor devices (in 603); and encapsulating the plurality of power semiconductor devices with encapsulation material such that at least one edge region of the surface of the electrically conductive plate is free from the encapsulation material (in 604).

Details of various embodiments of the processes may have been described above, for example in context with the figures visualizing the process.

FIG. 7 shows a diagram illustrating a method 700 of forming a semiconductor arrangement in accordance with various embodiments. Details of the various processes may be described above.

The method 700 may include material preparation (in 701), e.g. preparing various materials to be used during the processes of the method. The method may further include a first attach process (in 702), during which the plurality of power semiconductor devices may be attached, e.g. connected, to the electrically conductive plate, e.g. a molybdenum plate. The method may further include a second die attach process (in 703) for connecting the plurality of electrically conductive blocks with the plurality of power semiconductor devices. The method may further include a third attach process, e.g. an attach process for forming a control terminal interconnection structure (also referred to as gate layer, in 704) and an optional process of applying an adhesion promoter to surfaces of the semiconductor arrangement that may be in contact with encapsulation material (in 705). The method may further include forming an encapsulation (in 706), e.g. by molding. The method may further include an optional grinding process (in 707). For quality control, the method may, in various embodiments, include a testing process (in 708), e.g. an electrical testing. The method may further include a so-called marking/scanning/packaging process (in 709), which may include an optical inspection and/or a Confocal Scanning Acoustic Microscopy (CSAM) inspection, marking and packing. The method may further include shipping (in 710).

In various embodiments, a semiconductor arrangement is provided. The semiconductor arrangement may include an electrically conductive plate having a surface, a plurality of power semiconductor devices arranged on the surface of the electrically conductive plate, wherein a first controlled terminal of each power semiconductor device of the plurality of power semiconductor devices may be electrically coupled to the electrically conductive plate, a plurality of electrically conductive blocks, wherein each electrically conductive block may be electrically coupled with a respective second controlled terminal of each power semiconductor device of the plurality of power semiconductor devices, and encapsulation material encapsulating the plurality of power semiconductor devices, wherein at least one edge region of the surface of the electrically conductive plate may be free from the encapsulation material.

In various embodiments, at least one portion of a top surface of the semiconductor arrangement opposite the electrically conductive plate may be electrically coupled with the respective second controlled terminal of each power semiconductor device of the plurality of power semiconductor devices.

In various embodiments, the semiconductor arrangement may be configured to have a current flowing between the at least one portion of the top surface and the electrically conductive plate.

In various embodiments, the current may be a main current.

In various embodiments, the semiconductor arrangement may further include a sealing structure.

In various embodiments, the sealing structure may include a sealing element.

In various embodiments, the sealing element may be a sealing ring.

In various embodiments, the sealing ring may be arranged on the at least one edge region of the surface of the electrically conductive plate.

In various embodiments, the sealing element may be embedded in the encapsulation material.

In various embodiments, the encapsulation material may include sealing properties.

In various embodiments, the encapsulation material may include or consist of silicone.

In various embodiments, the sealing structure may include an elastic high temperature resistance material.

In various embodiments, the sealing element, e.g. the sealing ring, may consist of the elastic high temperature resistance material.

In various embodiments, the semiconductor arrangement may further include an electrically conductive layer arranged over the plurality of electrically conductive blocks and over the encapsulation material.

In various embodiments, the electrically conductive layer, the sealing structure and the electrically conductive plate may be arranged to form at least part of an hermetic sealing of the plurality of semiconductor devices.

In various embodiments, the semiconductor arrangement may further include at least one control terminal for controlling a current between the first controlled terminal and the second controlled terminal of at least one power semiconductor device of the plurality of power semiconductor devices.

In various embodiments, the plurality of power semiconductor devices may include a plurality of IGBTs.

In various embodiments, the plurality of power semiconductor devices may include at least one power diode.

In various embodiments, the electrically conductive plate may further include a second surface opposite the surface and a side surface connecting the surface and the second surface, and the second surface and the side surface may be free from the encapsulation material.

In various embodiments, the electrically conductive plate and/or the plurality of electrically conductive blocks may include at least one electrically conductive material of the group of electrically conductive materials consisting of molybdenum; copper; and carbon.

In various embodiments, a semiconductor system is provided. The semiconductor system may include a plurality of the above described semiconductor arrangements.

In various embodiments, a connecting surface between the at least one portion of the top surface of the semiconductor arrangement and the electrically conductive plate includes a structure increasing a surface distance between the at least one portion of the top surface of the semiconductor arrangement and the electrically conductive plate.

In various embodiments, a method of forming a semiconductor arrangement is provided. The method may include arranging a plurality of power semiconductor devices on a surface of a electrically conductive plate, electrically coupling a first controlled terminal of each power semiconductor device of the plurality of power semiconductor devices to the electrically conductive plate, electrically coupling each electrically conductive block of a plurality of electrically conductive blocks with a respective second controlled terminal of each power semiconductor device of the plurality of power semiconductor devices; and encapsulating the plurality of power semiconductor devices with encapsulation material such that at least one edge region of the surface of the electrically conductive plate is free from the encapsulation material. In various embodiments, the encapsulating may include molding.

In various embodiments, the molding may include one of transfer molding and compression molding.

In various embodiments, during the transfer molding, a surface of each of the plurality of electrically conductive blocks facing away from the respective power semiconductor device of the plurality of power semiconductor devices may remain free from the encapsulation material.

In various embodiments, the method may further include arranging a sealing element on the at least one edge region.

In various embodiments, the sealing element may be a sealing ring.

In various embodiments, the method may further include arranging an electrically conductive layer over the plurality of electrically conductive blocks and over the encapsulation material.

In various embodiments, the method may further include forming an hermetic sealing for the plurality of power semiconductor devices by forming an hermetically sealed connection between the electrically conductive layer and the sealing ring and by pressing the sealing ring onto the at least one edge region.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor arrangement, comprising:
   an electrically conductive plate having a top surface;
   a plurality of power semiconductor devices arranged on the top surface of the electrically conductive plate, wherein a first controlled terminal of each power semiconductor device of the plurality of power semiconductor devices is electrically coupled to the electrically conductive plate;
   a plurality of electrically conductive blocks, each electrically conductive block being electrically coupled with a respective second controlled terminal of each power semiconductor device of the plurality of power semiconductor devices; and
   encapsulation material encapsulating the plurality of power semiconductor devices, wherein at least one edge region of the top surface of the electrically conductive plate is free from the encapsulation material.

2. The semiconductor arrangement of claim 1,
   wherein at least one portion of a top surface of the semiconductor arrangement opposite the electrically conductive plate is electrically coupled with the respective second controlled terminal of each power semiconductor device of the plurality of power semiconductor devices.

3. The semiconductor arrangement of claim 2,
   wherein the semiconductor arrangement is configured to have a current flowing between the at least one portion of the top surface and the electrically conductive plate.

4. The semiconductor arrangement of claim 1, further comprising at least one control terminal for controlling a current between the first controlled terminal and the second controlled terminal of at least one power semiconductor device of the plurality of power semiconductor devices.

5. The semiconductor arrangement of claim 1, further comprising a sealing structure.

6. The semiconductor arrangement of claim 5, wherein the sealing structure comprises a sealing element.

7. The semiconductor arrangement of claim 6, wherein the sealing element is a sealing ring.

8. The semiconductor arrangement of claim 6, wherein the sealing element is arranged on the at least one edge region of the top surface of the electrically conductive plate.

9. The semiconductor arrangement of claim 6, wherein the sealing element is embedded in the encapsulation material.

10. The semiconductor arrangement of claim 1, wherein the encapsulation material comprises sealing properties.

11. The semiconductor arrangement of claim 1, further comprising an electrically conductive layer arranged over the plurality of electrically conductive blocks and over the encapsulation material.

12. The semiconductor arrangement of claim 11, wherein the electrically conductive layer, a sealing structure and the electrically conductive plate are arranged to form at least part of an hermetic sealing of the plurality of semiconductor devices.

13. The semiconductor arrangement of claim 1, wherein the plurality of power semiconductor devices comprises a plurality of IGBTs.

14. The semiconductor arrangement of claim 1, wherein the plurality of power semiconductor devices comprises at least one power diode.

15. The semiconductor arrangement of claim 1,
    wherein the electrically conductive plate further comprises a second surface opposite the top surface and a side surface connecting the top surface and the second surface; and
    wherein the second surface and the side surface are free from the encapsulation material.

16. The semiconductor arrangement of claim 1,
    wherein the electrically conductive plate and/or the plurality of electrically conductive blocks comprises at least one electrically conductive material of the group of electrically conductive materials consisting of
    molybdenum;
    copper; and
    carbon.

17. The semiconductor arrangement of claim 2,
    wherein a connecting surface between the at least one portion of the top surface of the semiconductor arrangement and the electrically conductive plate comprises a structure increasing a distance along a surface of the structure between the at least one portion of the top surface of the semiconductor arrangement and the electrically conductive plate.

18. A semiconductor system comprising a plurality of semiconductor arrangements, each semiconductor arrangement comprising:
    an electrically conductive plate having a top surface;
    a plurality of power semiconductor devices arranged on the top surface of the electrically conductive plate, wherein a first controlled terminal of each power semiconductor device of the plurality of power semiconductor devices is electrically coupled to the electrically conductive plate;

a plurality of electrically conductive blocks, each electrically conductive block being electrically coupled with a respective second controlled terminal of each power semiconductor device of the plurality of power semiconductor devices; and encapsulation material encapsulating the plurality of power semiconductor devices, wherein at least one edge region of the top surface of the electrically conductive plate is free from the encapsulation material.

19. A method of forming a semiconductor arrangement, the method comprising:

arranging a plurality of power semiconductor devices on a top surface of an electrically conductive plate;

electrically coupling a first controlled terminal of each power semiconductor device of the plurality of power semiconductor devices to the electrically conductive plate;

electrically coupling each electrically conductive block of a plurality of electrically conductive blocks with a respective second controlled terminal of each power semiconductor device of the plurality of power semiconductor devices; and encapsulating the plurality of power semiconductor devices with encapsulation material such that at least one edge region of the top surface of the electrically conductive plate is free from the encapsulation material.

20. The method of claim 19, wherein the encapsulating comprises molding.

21. The method of claim 20, wherein the molding comprises one of transfer molding and compression molding.

22. The method of claim 21, wherein, during the transfer molding, a surface of each of the plurality of electrically conductive blocks facing away from the respective power semiconductor device of the plurality of power semiconductor devices remains free from the encapsulation material.

23. The method of claim 19, further comprising:
arranging a sealing element on the at least one edge region.

24. The method of claim 23, wherein the sealing element is a sealing ring.

25. The method of claim 19, further comprising:
arranging an electrically conductive layer over the plurality of electrically conductive blocks and over the encapsulation material.

26. The method of claim 24, further comprising:
forming an hermetic sealing for the plurality of power semiconductor devices by forming an hermetically sealed connection between the electrically conductive layer and the sealing ring and by pressing the sealing ring onto the at least one edge region.

* * * * *